US011659716B2

(12) United States Patent
Juengling

(10) Patent No.: US 11,659,716 B2
(45) Date of Patent: May 23, 2023

(54) MEMORY CIRCUITRY AND METHODS OF FORMING MEMORY CIRCUITRY

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 336 days.

(21) Appl. No.: 17/118,846

(22) Filed: Dec. 11, 2020

(65) Prior Publication Data

US 2021/0134815 A1    May 6, 2021

Related U.S. Application Data

(62) Division of application No. 16/212,981, filed on Dec. 7, 2018, now Pat. No. 10,886,285.

(51) Int. Cl.
*H01L 27/11* (2006.01)
*H01L 21/30* (2006.01)
*H01L 21/76* (2006.01)
*H01L 27/11509* (2017.01)
*H01L 21/768* (2006.01)
*H01L 21/308* (2006.01)

(52) U.S. Cl.
CPC ...... *H01L 27/11509* (2013.01); *H01L 21/308* (2013.01); *H01L 21/76898* (2013.01)

(58) Field of Classification Search
CPC ............. H01L 27/11509; H01L 21/308; H01L 21/76898
See application file for complete search history.

(56) References Cited

U.S. PATENT DOCUMENTS

2020/0066731 A1    2/2020 Iwaki

*Primary Examiner* — Fernando L Toledo
*Assistant Examiner* — Valerie N Newton
(74) *Attorney, Agent, or Firm* — Wells St. John P.S.

(57) ABSTRACT

A method of forming memory circuitry comprises using a digitline mask to form both: (a) conductive digitlines in a memory array area, and (b) lower portions of conductive vias in a peripheral circuitry area laterally of the memory array area. The lower portions of the vias electrically couple with circuitry below the vias and the digitlines. Pairs of conductive wordlines are formed above the digitlines in the memory array area. The pairs of wordlines extend from the memory array area into the peripheral circuitry area. Individual of the pairs are directly above individual of the lower portions of individual of the vias. Individual upper portions of the individual vias are formed. The individual upper portions both: (c) directly electrically couple to one of the individual lower portions of the individual vias, and (d) directly electrically couple together the wordlines of the individual pair of wordlines that are directly above the respective one individual lower portion of the respective individual via. Other methods, and structure independent of method of fabrication, are disclosed.

11 Claims, 26 Drawing Sheets

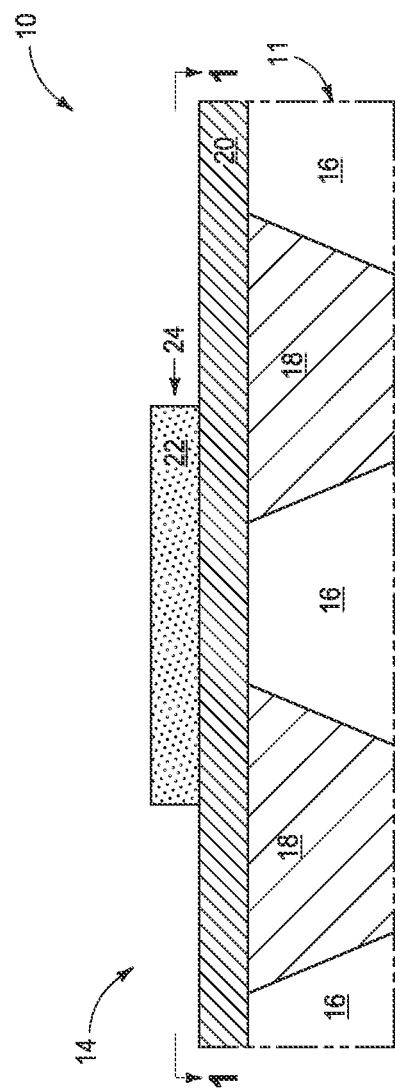
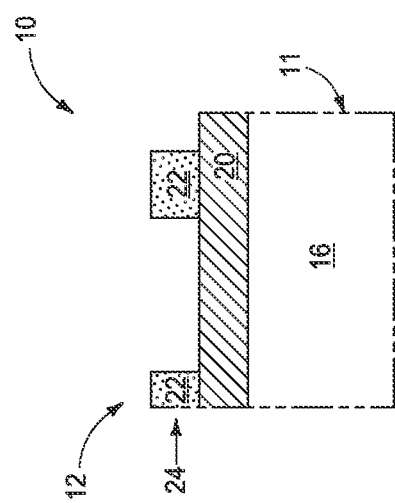
FIG. 3
FIG. 2

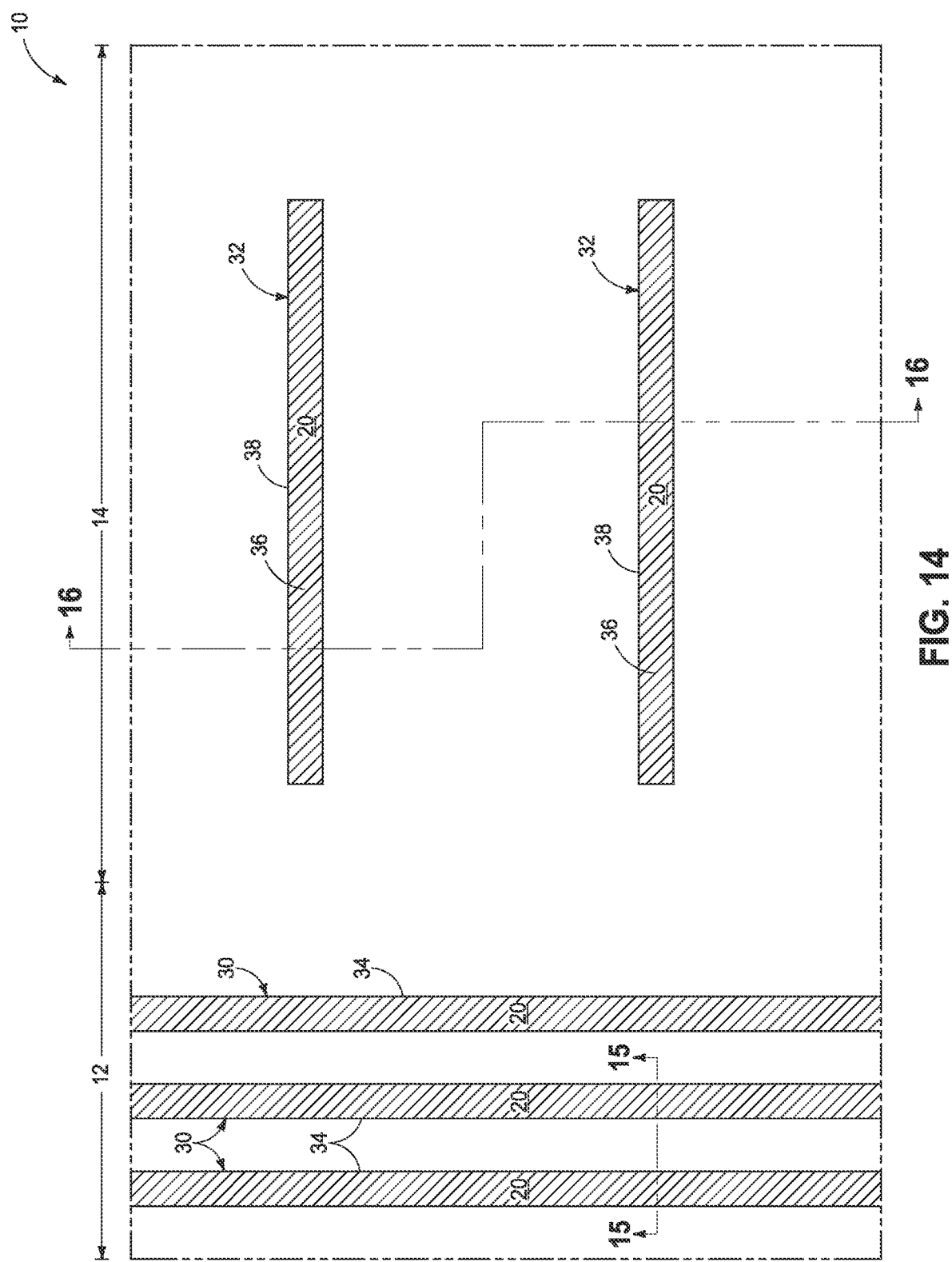

US 11,659,716 B2

MEMORY CIRCUITRY AND METHODS OF FORMING MEMORY CIRCUITRY

RELATED PATENT DATA

This patent resulted from a divisional application of U.S. patent application Ser. No. 16/212,981, filed Dec. 7, 2018, entitled "Memory Circuitry And Methods Of Forming Memory Circuitry", naming Werner Juengling as inventor, the disclosure of which is incorporated by reference.

TECHNICAL FIELD

Embodiments disclosed herein pertain to memory circuitry and to methods of forming memory circuitry.

BACKGROUND

Memory is one type of integrated circuitry and is used in computer systems for storing data, Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory, may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferro-electric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the hi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Existing and future-developed memory cells may comprise both a transistor and a capacitor, a capacitor and no transistor, a transistor and no capacitor, or no capacitor and no transistor.

BRIEF DESCRIPTION OF THE DRAWINGS

FIG. 2 is a view taken through line 2-2 in FIG. 1.

FIG. 3 is a view taken through line 3-3 in FIG. 1.

FIG. 14 is a view of the FIG. 13 construction at a processing step subsequent to that shown by FIG. 13.

DETAILED DESCRIPTION OF EXAMPLE EMBODIMENTS

Embodiments of the invention encompass memory circuitry and methods of forming memory circuitry. Example method embodiments are first described with reference to FIGS. 1-35.

Figure 1:
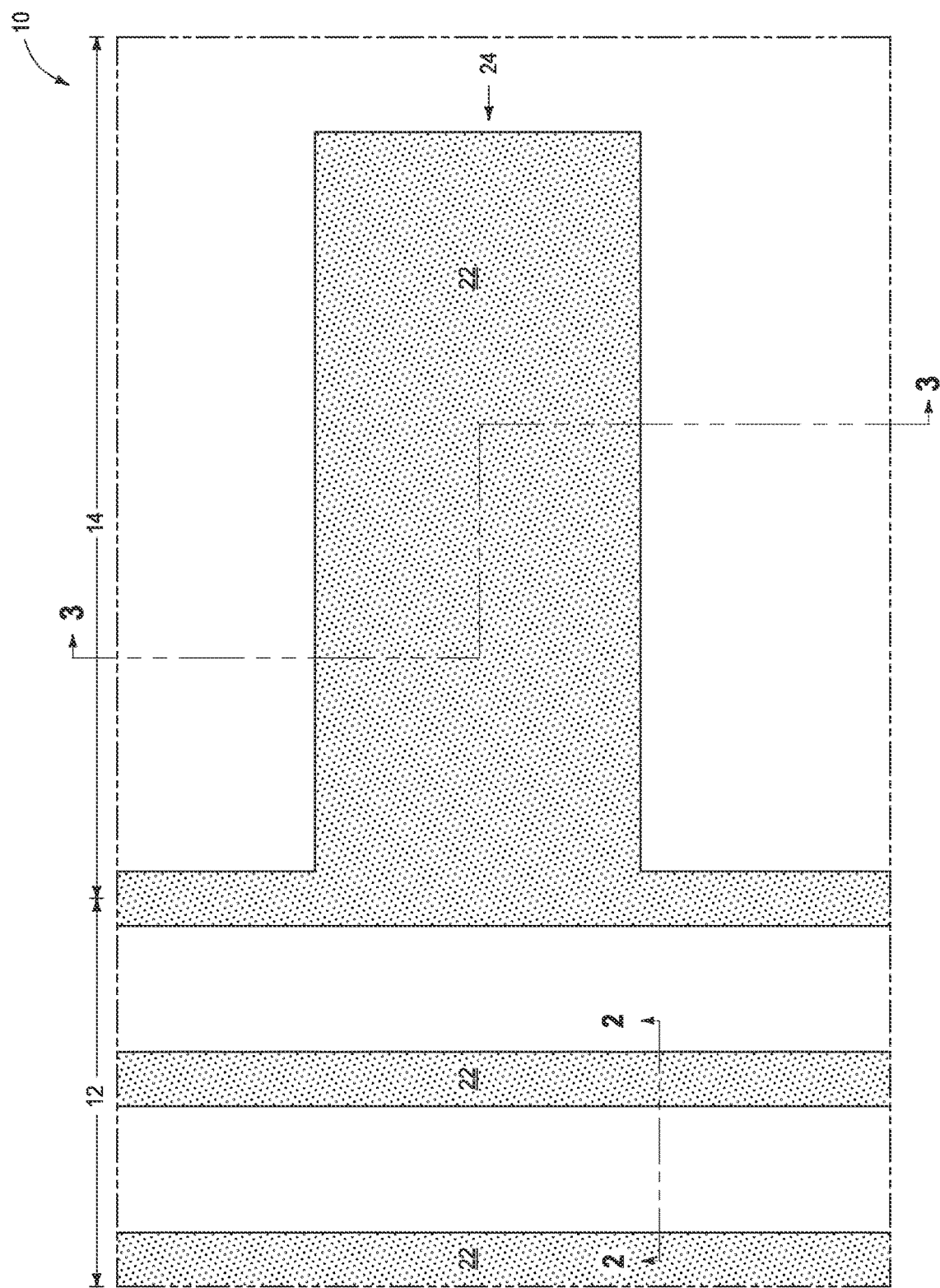
FIG. 1 is a diagrammatic cross-sectional view of a portion of a construction in process in accordance with some embodiments of the invention.

Referring to FIGS. 1-3, a substrate construction 10 is shown in process in a method of forming memory circuitry. Construction 10 comprises a memory array area 12 and a peripheral circuitry area 14 laterally thereof. Construction 10 comprises a base substrate 11 having any one or more of conductive/conductor/conducting, semiconductive/semiconductor/semiconducting, or insulative/insulator/insulating (i.e., electrically herein) materials. Materials may be aside, elevationally inward, or elevationally outward of the FIGS. 1-3—depicted materials. For example, other partially or wholly fabricated components of integrated circuitry may be provided somewhere above, about, or within base substrate 11. Control and/or other peripheral circuitry for operating components within an array (e.g., within an array area 12) of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Example base substrate 11 is shown as comprising insulating material 16 (e.g., silicon dioxide and/or silicon nitride), with peripheral circuitry area 14 comprising conductive material 18 in insulating material 16 as part of some peripheral or other circuitry (e.g., of one or more circuitry component[s]) that is not otherwise material to the invention but for its elevation within construction 10 in some embodiments. Conductive material 20 has been formed above base substrate 11. Masking material 22 (e.g., photoresist) has been formed over conductive material 20 and has been patterned to collectively form a mask 24. Mask 24, regardless of presence of conductive material 20, may be a digitline mask or may be used to form a digitline mask as will be apparent from the continuing discussion. In the context of this document, a "digitline mask" is a patterned masking layer formed as part of a substrate construction 10 that is at least in part used to form outlines of digitlines within memory array area 12. The discussion proceeds with respect to but one example embodiment that uses what is commonly referred to as "spacer patterning" or "pitch multiplication" wherein mask 24 is not a digitline mask but is used to form a digitline mask, and which is followed by a brief description of an alternate embodiment wherein mask 24 is a digitline mask.

Figure 5:
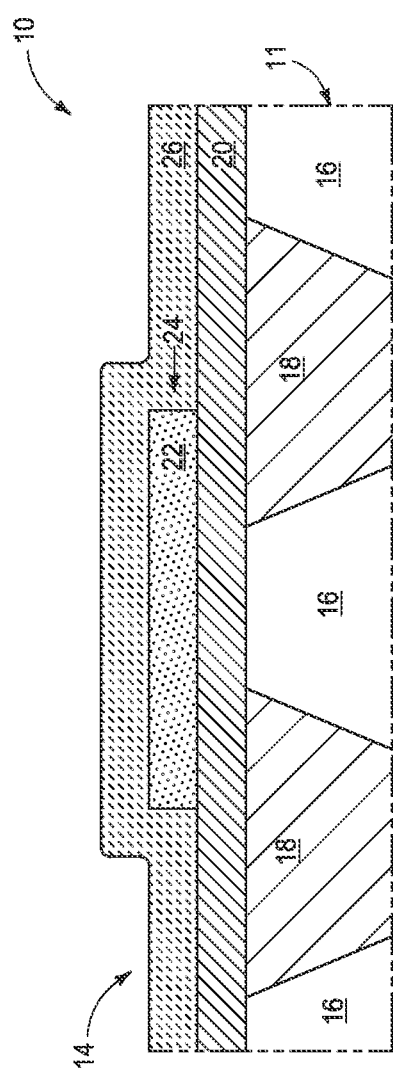
FIG. 5 is a view of the FIG. 4 construction corresponding to the cross-section of FIG. 3.
Figure 4:
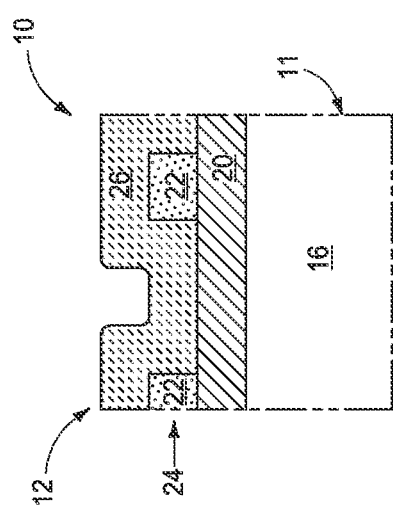
FIG. 4 is a view of the FIG. 2 construction at a processing step subsequent to that shown by FIG. 2.
Figure 6:
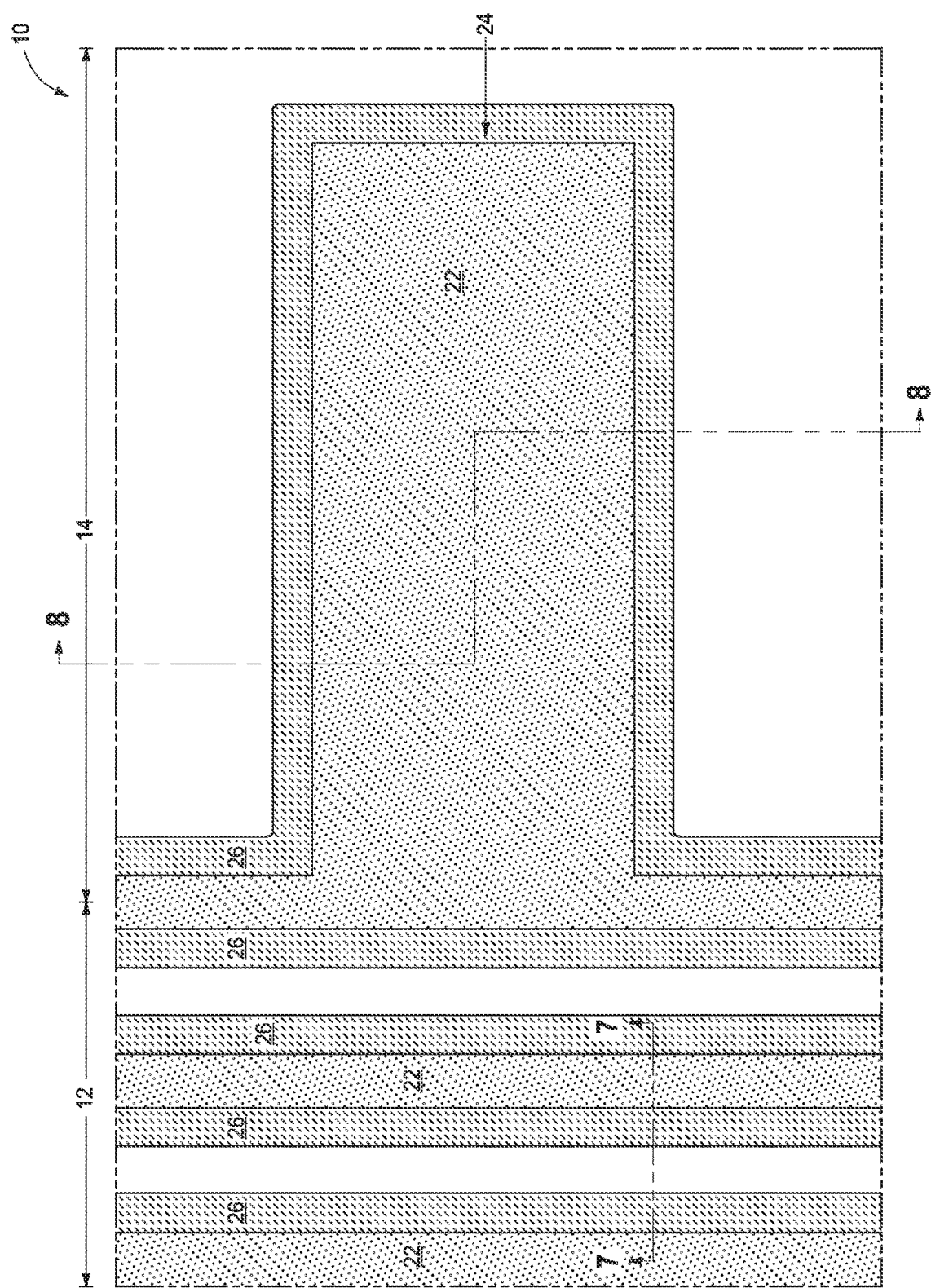
FIG. 6 is a view of the FIG. 4 construction at a processing step subsequent to that shown by FIG. 4.
Figure 8:
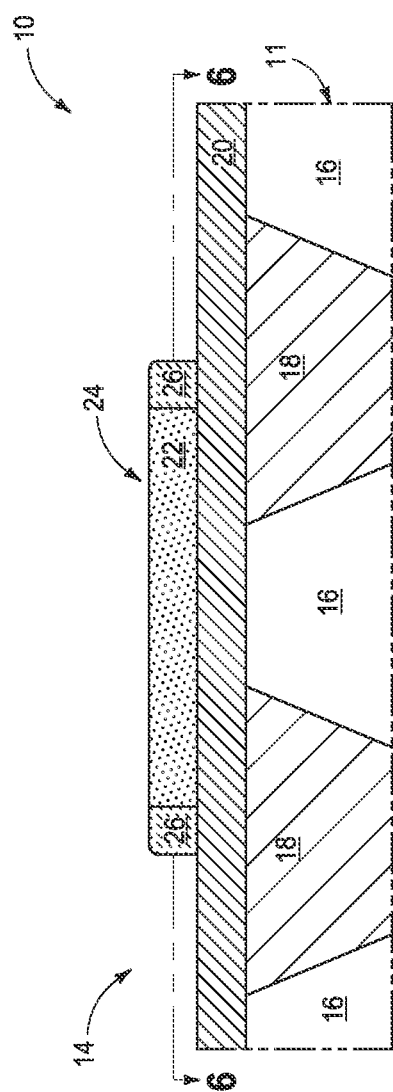
FIG. 8 is a view taken through line 8-8 in FIG. 6.
Figure 7:
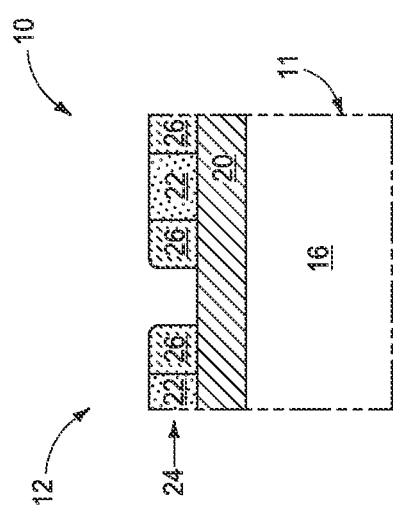
FIG. 7 is a view taken through line 7-7 in FIG. 6.
Figure 9:
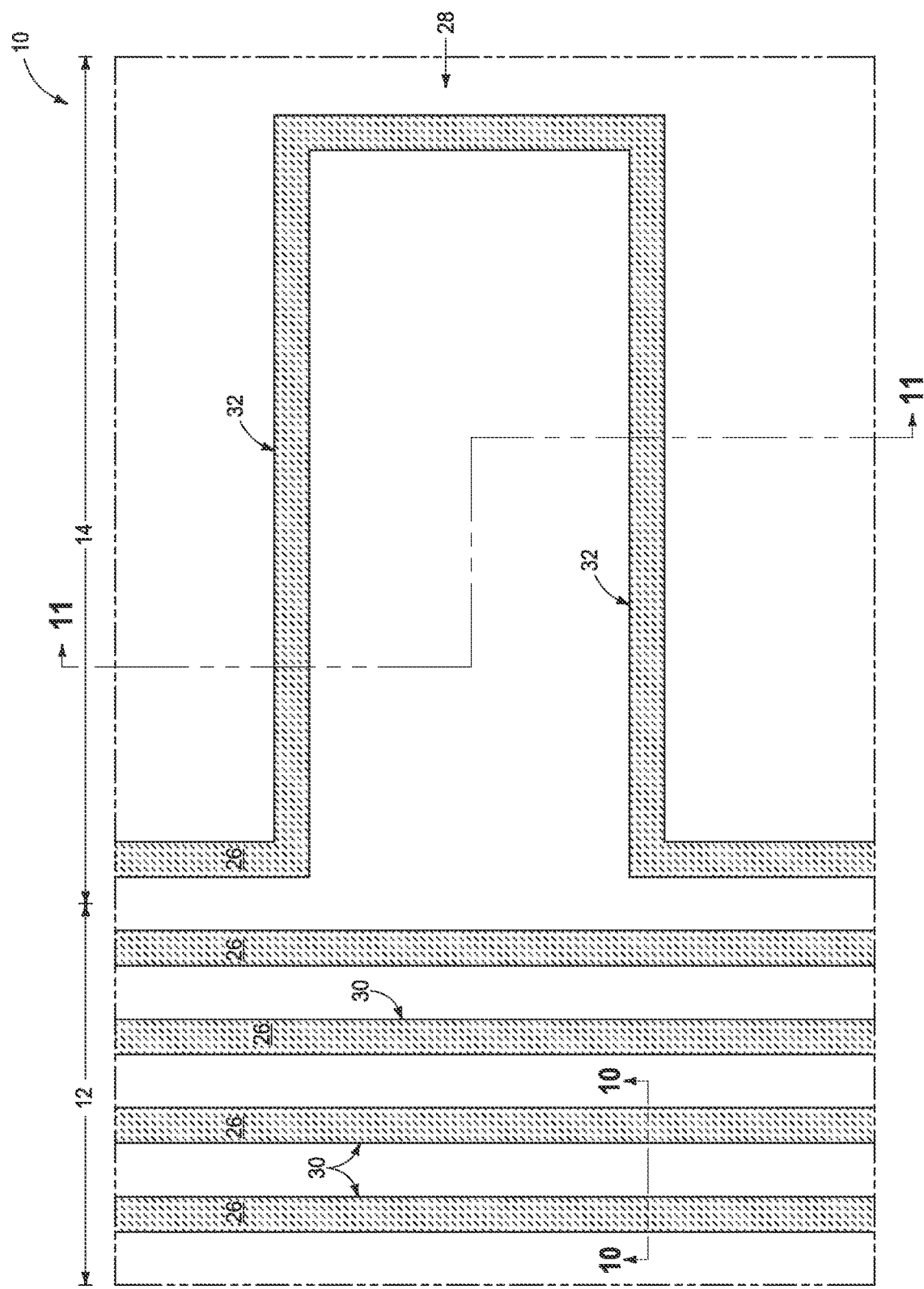
FIG. 9 is a view of the FIG. 6 construction at a processing step subsequent to that shown by FIG. 6.
Figure 11:
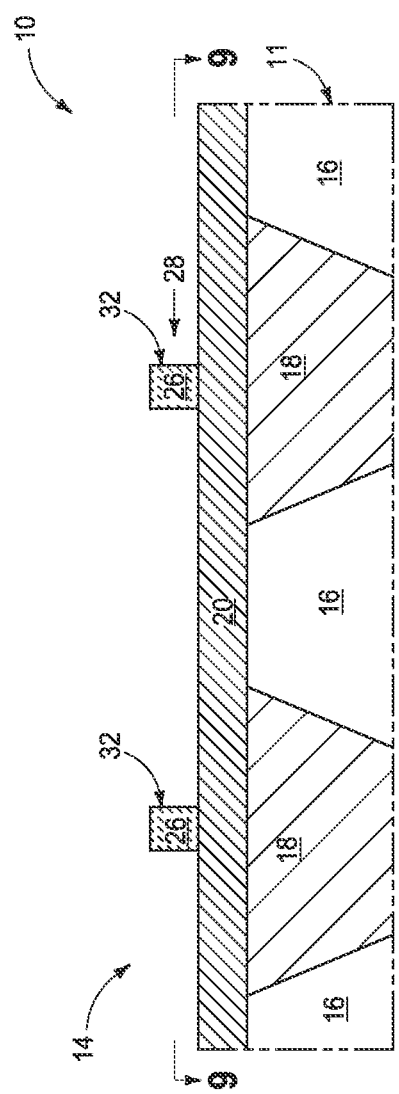
FIG. 11 is a view taken through line 11-11 in FIG. 9.
Figure 10:
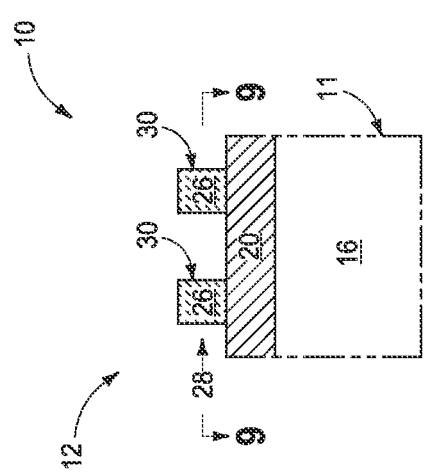
FIG. 10 is a view taken through line 10-10 in FIG. 9.

Referring to FIGS. 4 and 5, masking material 26 (e.g., silicon dioxide or silicon nitride) ideally of different composition from that of masking material 22 has been formed conformally over masking material 22. FIGS. 6-8 show subsequent maskless anisotropic etching having been conducted of masking material 26 to remove such from being atop masking material 22 and to clear some of masking material 26 from being over conductive material 20 except where immediately-proximate sidewalls of masking material 22. FIGS. 9-11 show subsequent removal of masking material 22 (not shown) selectively relative to masking material 26 (e.g., FIGS. 4-11 showing a spacer-patterning example).

Figure 12:
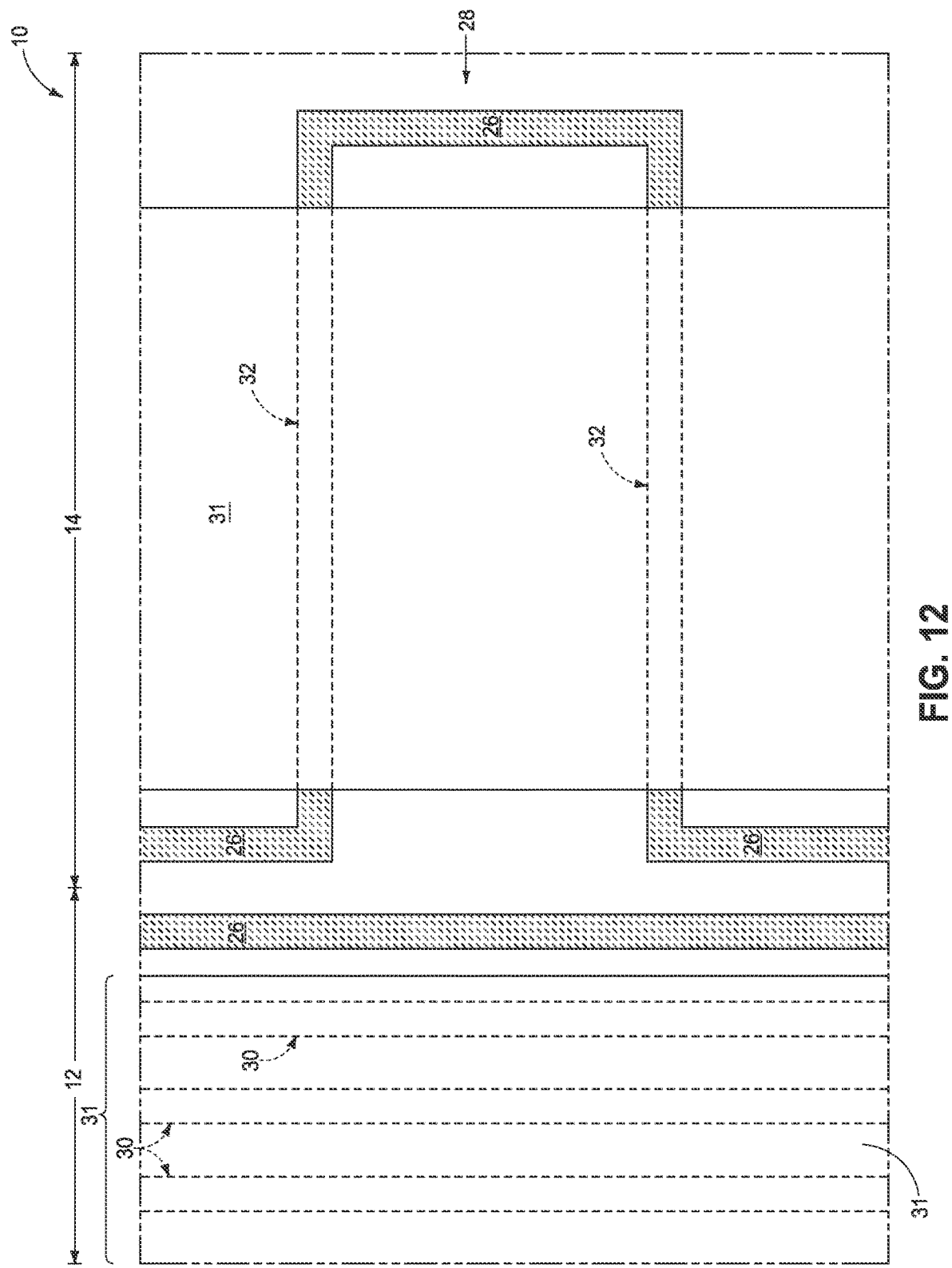
FIG. 12 is a view of the FIG. 9 construction at a processing step subsequent to that shown by FIG. 9.
Figure 13:
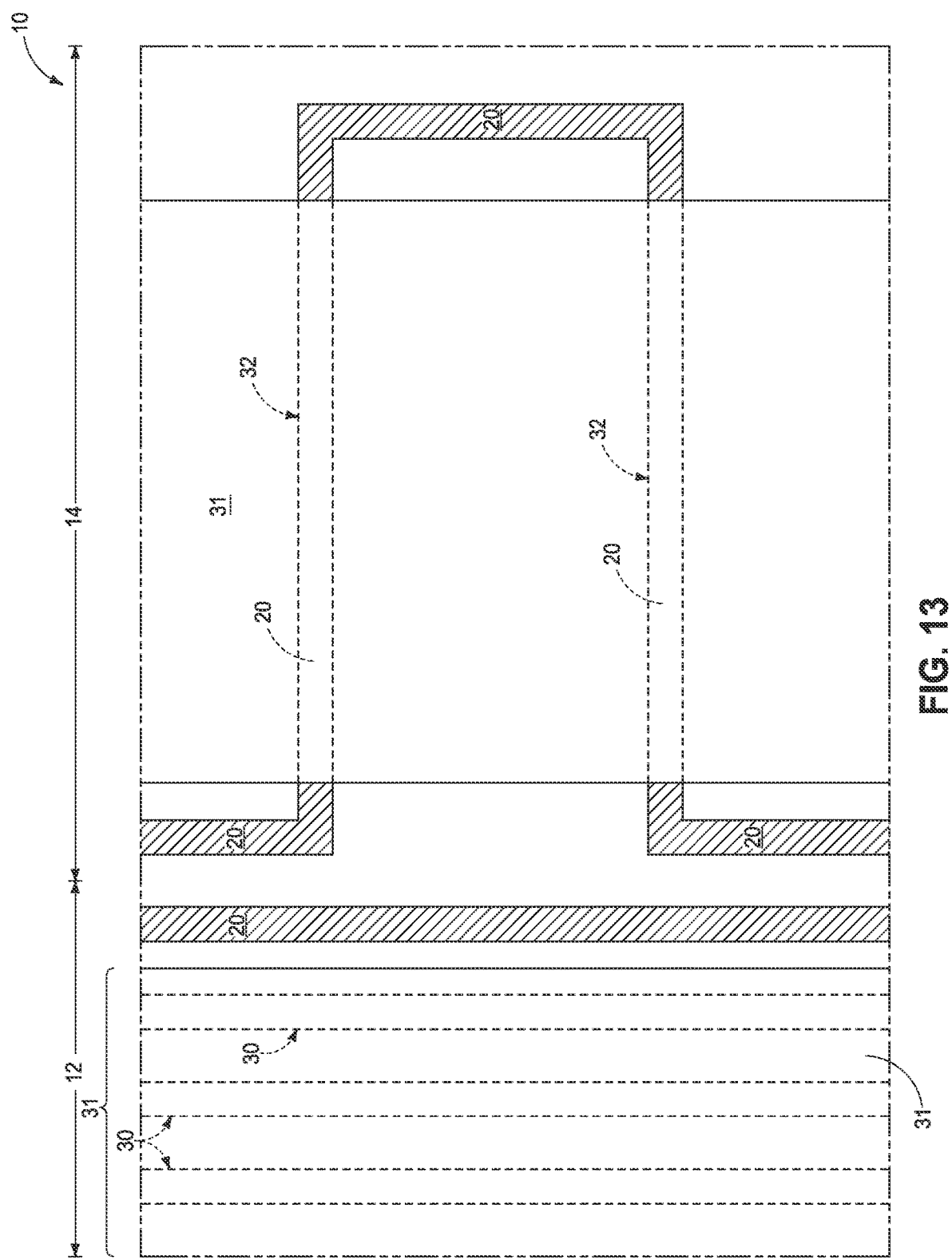
FIG. 13 is a view of the 2 construction at a processing step subsequent to that shown by FIG. 12.

FIGS. 12 and 13 show subsequent processing whereby patterned masking material 31 (e.g., photoresist) has been formed atop or as part of construction 10 followed by etching of exposed masking material 26 selectively relative to conductive material 20 (FIG. 13) with, for example, patterned masking material 26 forming a mask 28 (FIGS. 10 and 11) which in one embodiment comprises a digitline mask. Digitline mask 28 comprises a plurality of digitline outlines 30 in memory array area 12 and comprises a plurality of outlines 32 of lower portions (not yet shown) of conductive vias (not yet shown).

Figure 16:
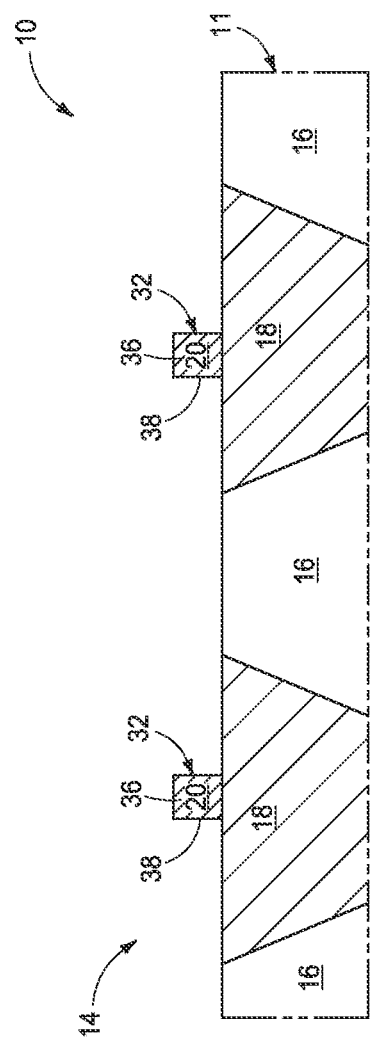
FIG. 16 is a view taken through line 16-16 in FIG. 14.
Figure 15:
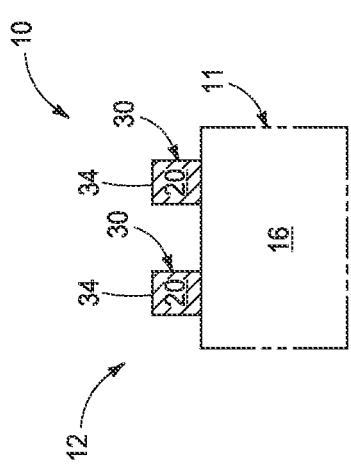
FIG. 15 is a view taken through line 15-15 in FIG. 14.

Referring to FIGS. 14-16, masking material 31 (not shown) has been removed, followed by using masking material 26 of digitline mask 28 as a mask while etching away unmasked portions of conductive material 20 to form conductive digitlines 34 comprising conductive material 20 in memory array area 12 and to form lower portions 36 of conductive vias 38 comprising conductive material 20 in peripheral circuitry area 14, followed by removal of digitline mask 28/masking material 26 (not shown).

The above described processing is but one example of forming a digitline mask 28 that is used to form both: (a) conductive digitlines 34 in memory array area 12, and (b) lower portions 36 of conductive vias 38 in a peripheral circuitry area 14, with such lower portions 36 of vias 38 electrically coupling, in one embodiment directly electrically coupling, with circuitry (e.g., of which conductive material 18 is a part) that is below vias 38 and digitlines 34. Alternate existing or future-developed processing may be used to form both (a) and (b). As one example, but less preferred, the mask of FIG. 12 might be used to etch away exposed portions conductive material 20 before forming masking material 22. As another example, mask construction 24 as shown in FIGS. 1-3 could be formed in the absence of conductive material (e.g., no 20) there-below that would be used to form the digitlines and lower portions of the vias. Rather, in such latter another example, material 26 could be conductive material that is deposited and patterned analogously to that shown by FIGS. 4-11 whereby mask 24 effectively is a digitline mask, and which is followed by subsequent patterning thereof shown by FIGS. 12 and 13 to ultimately arrive at a construction as shown in FIGS. 14-16 (e.g., thereby using what is a digitline mask 24 to form both (a) and (b) as described above). Such is essentially another/alternate pitch-multiplication/spacer-patterning technique. Alternately, no spacer patterning or pitch multiplication may be used, and any existing or future-develop techniques may be used to perform an example mask 24/28 as described above that is used as a digitline mask to form both (a) and (b).

Figure 18:
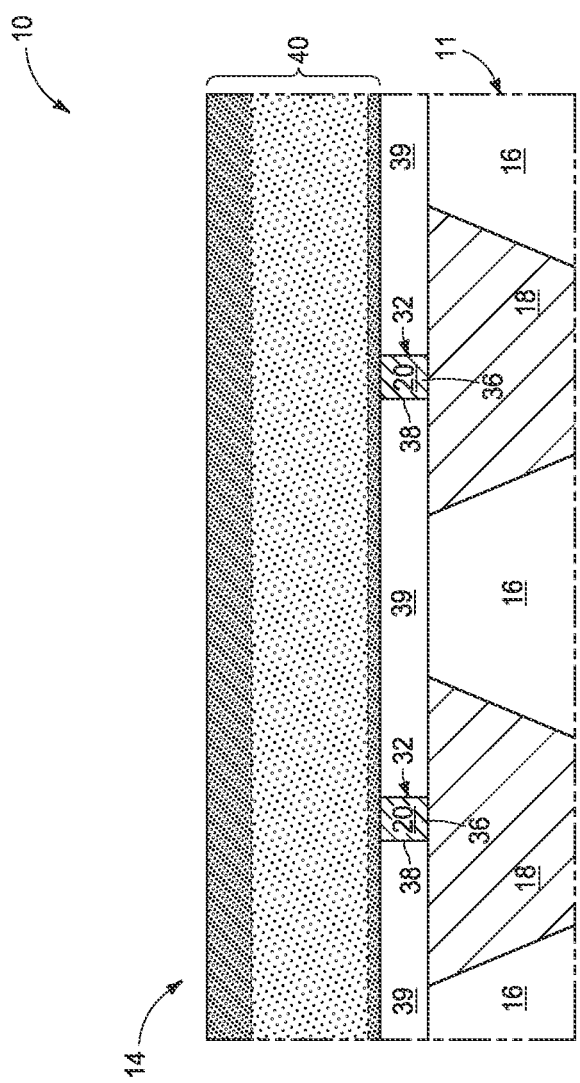
FIG. 18 is a view of the FIG. 17 construction corresponding to the cross-section of FIG. 16.
Figure 17:
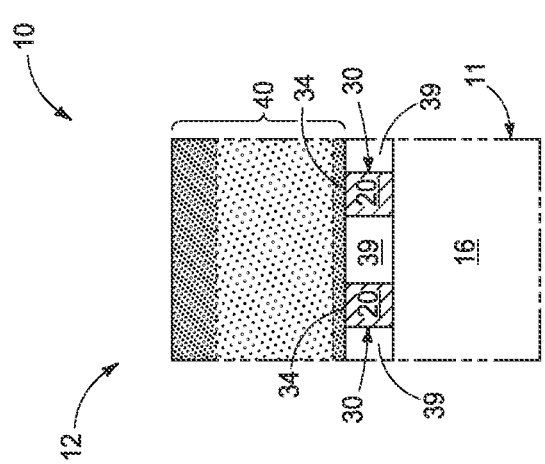
FIG. 17 is a view of the FIG. 14 construction at a processing step subsequent to that shown by FIG. 14.

Referring to FIGS. 17 and 18, insulator material 39 (e.g., silicon dioxide or silicon nitride) has been formed and planarized back at least to elevationally-outermost surfaces of conductive material 20. Thereafter, material 40 has been deposited over insulator material 39 and conductive material 20. In one embodiment, material 40 will be used to form vertically-extending sacrificial structures (not yet shown) in peripheral circuitry area 14 and, regardless, in one embodiment material 40 will be used to form transistor source/drain regions and channel material of transistors of memory cells of memory circuitry (not yet shown) in memory array area 12, An example material 40 is doped and/or undoped semiconductor material, for example polysilicon that may be doped or undoped with conductivity-modifying impurity. Example material 40 is shown, by way of example only, as comprising uppermost and lowermost conductively-doped regions sandwiching there-between a region of lower and perhaps different conductivity-type doping. Example doping concentration/density in the figures is shown by stippling density, with denser stippling indicating greater dopant concentration and lighter stippling indicating lower dopant concentration relative one another. Material 40 if ultimately doped with conductivity-modifying impurity may be partially or totally so-doped at this point in the process or partially or wholly undoped at this point in the process.

Figure 19:
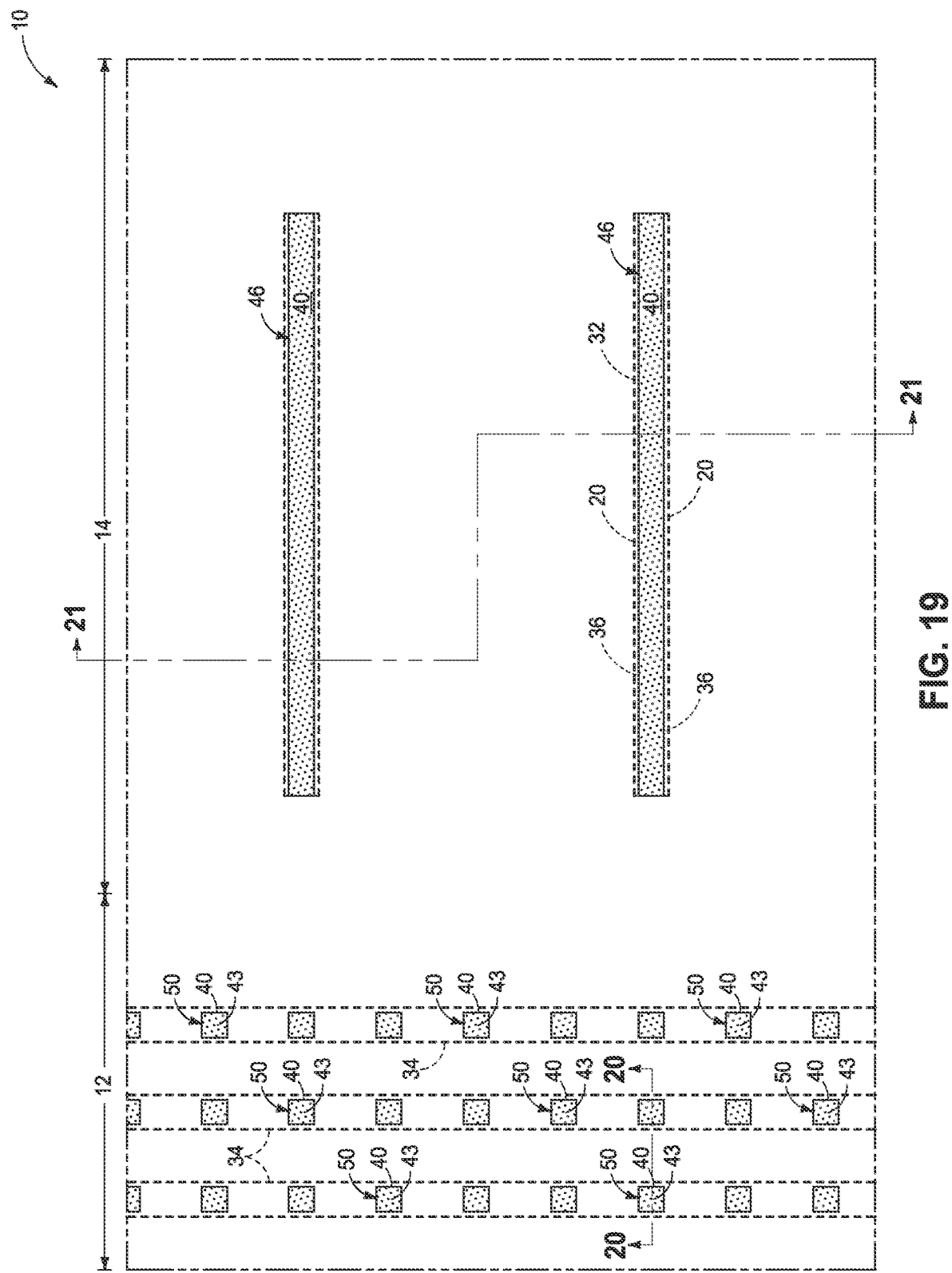
FIG. 19 is a view of the 7 construction at a processing step subsequent to that shown by FIG. 17.
Figure 21:
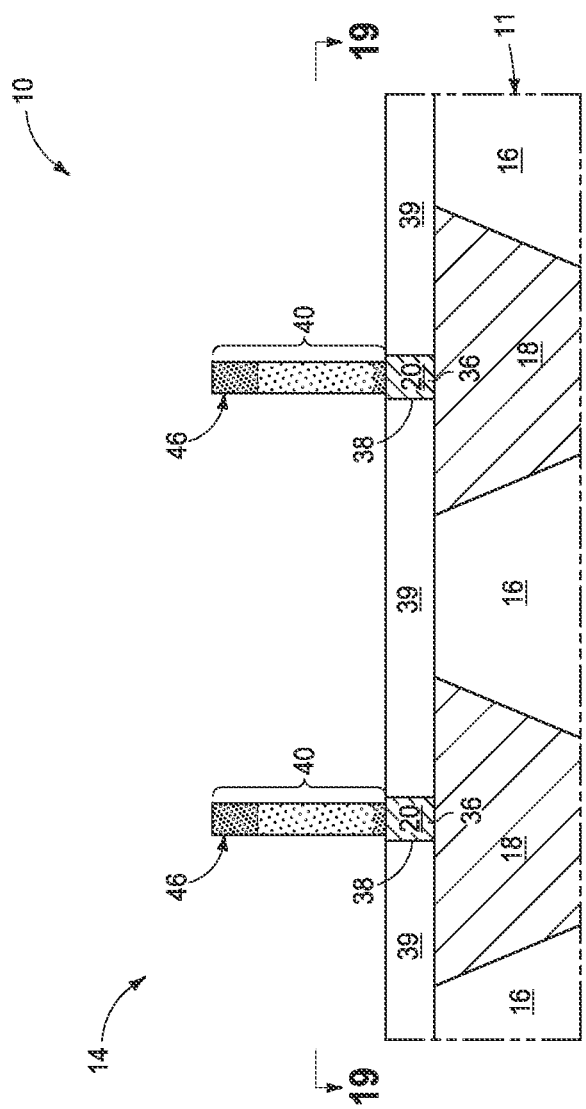
FIG. 21 is a view taken through line 21-21 in FIG. 19.
Figure 20:
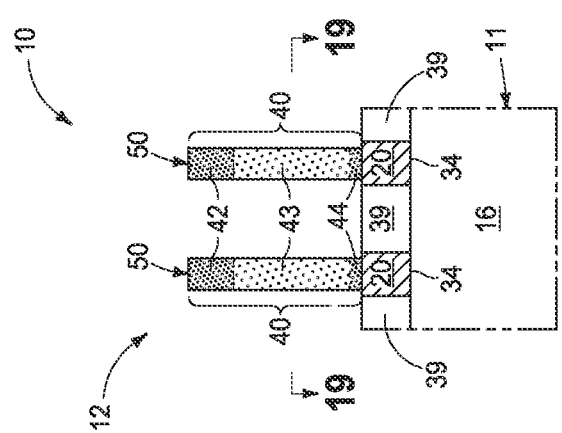
FIG. 20 is a view taken through line 20-20 in FIG. 19.

Referring to FIGS. 19-21, material 40 has been patterned to form vertically-extending sacrificial structures 46 that are above, in one embodiment directly above, individual lower portions 36 of individual vias 38. In one embodiment, sacrificial structures 46 are formed to predominately comprise polysilicon. In one embodiment, material 40 has also been patterned to form fin-like transistor structures 50 ultimately comprising a lower source/drain region 44, an upper source/drain region 42, and a channel region 43 there-between. In one embodiment, individual sacrificial structures 46 and lower portion 36 of the respective individual via 38 there-below are formed to be longitudinally coextensive (FIG. 19) and in one embodiment to not be laterally coextensive (FIGS. 19 and 21).

The above-described processing is an example wherein sacrificial structures 46 are formed at a different time than when digitlines 34 and lower portions 36 of vias 38 are formed and using another (i.e., a separate) mask. Alternately, and by way of example only, sacrificial structures 46 may be formed using the mask that is used to form digitlines 34 and lower portions 36 of conductive vias 38 (e.g., and essentially at the same time). As such an example, conductive material 20 and material 40 could be formed over substrate 11 of FIGS. 1-3 prior to forming masking material 22, and whereby material 40 of sacrificial structures 46 is ultimately etched before etching unmasked portions of conductive material 20. Such may facilitate, if desired, forming the individual sacrificial structures in the lower portion of the respective individual via there-below to be laterally coextensive (not shown).

Figure 22:
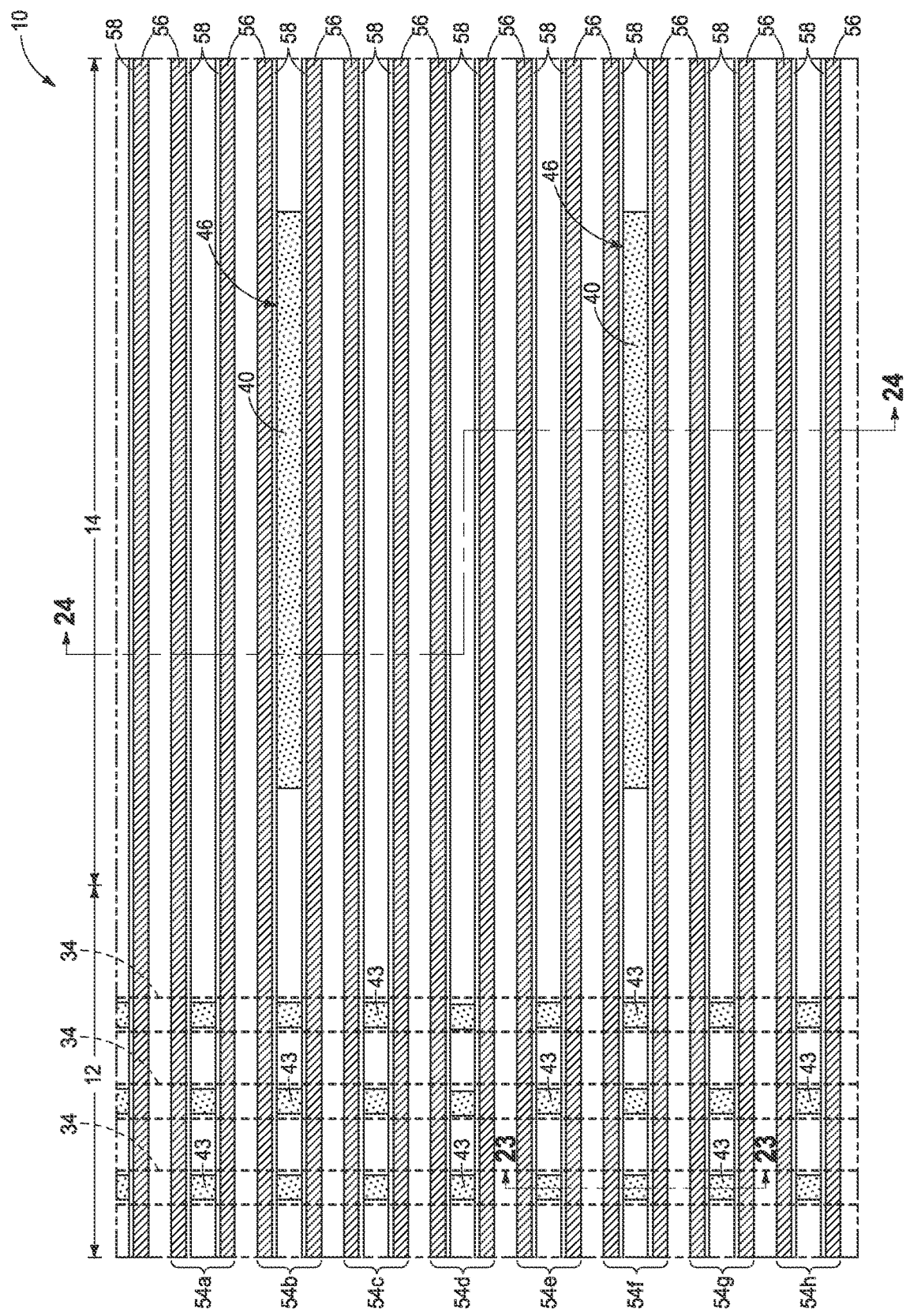
FIG. 22 is a view of the FIG. 19 construction at a processing step subsequent to that shown by FIG. 19.
Figures 23, 24:
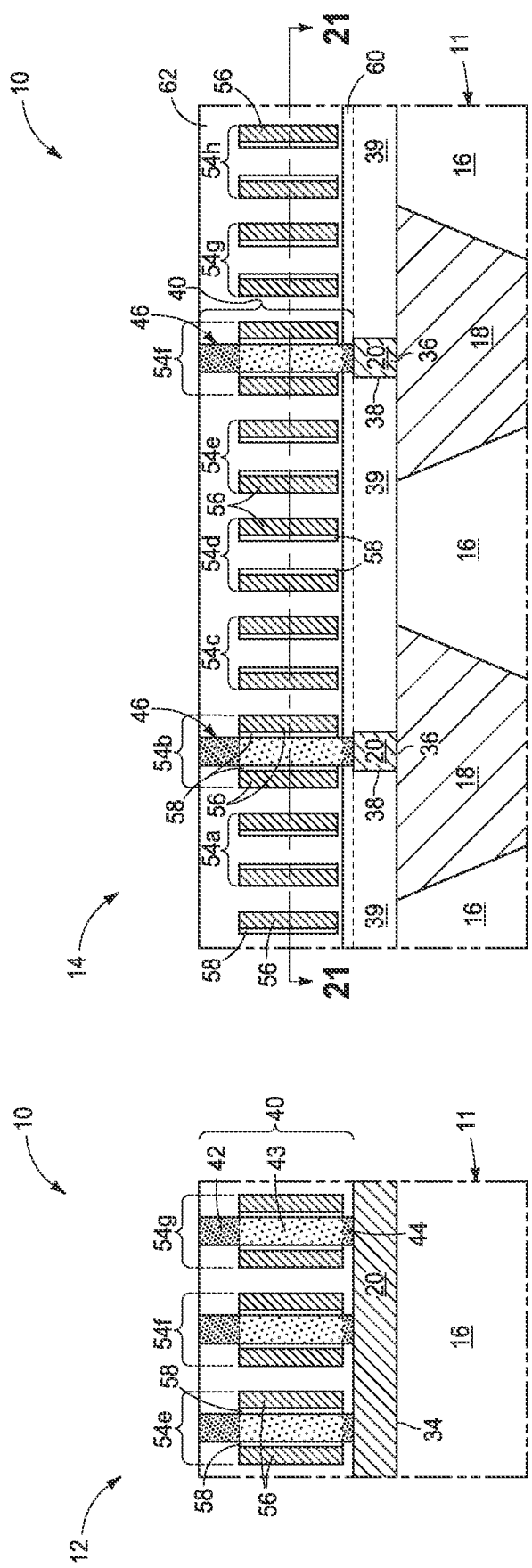
FIG. 23 is a view taken through line 23-23 in 22.
FIG. 24 is a view taken through line 24-24 in FIG. 22.

Referring to FIGS. 22-24, pairs 54a-54h (generically referred to as 54*) of conductive wordlines 56 have been formed above digitlines 34 in memory array area 12. Pairs 54* of wordlines 56 extend from memory array area 12 into peripheral circuitry area 14. In one embodiment, wordlines 56 of individual pairs 54* are against opposing sides of individual sacrificial structures 46. In one embodiment, individual pairs 54* are directly above individual lower portions 36 of individual vias 38. FIGS. 22-24 show but one example embodiment wherein every fourth pair 54* has an associated sacrificial structure 46 there-between in peripheral circuitry area 14 in the depicted cross-section. More or fewer pairs 54* could be between immediately-adjacent sacrificial structures 46, including a sacrificial structure 46 being associated with every pair 54* such that no other pair or pairs is/are there-between (not shown). Where one or more pairs 54* are between immediately adjacent sacrificial structures 46, those pairs 54* may have a sacrificial structure 46 to the right (not shown), for example, of the page upon which FIG. 22 lies, and which individually would be above a lower portion of another individual via. Alternately, and by way of example only, those pairs 54* may have a sacrificial structure 46 on the opposite side of memory array area 12 on which peripheral circuitry area 14 is received.

In one embodiment and as shown, a gate insulator 58 has been formed prior to forming pairs 54* of individual wordlines 56, with gate insulator 58 being against, in one embodiment directly against, opposing sides of individual sacrificial structures 46. In one embodiment, wordlines 56 in memory array area 12 and in peripheral circuitry area 14 have been formed against, in one embodiment directly against, gate insulator 58. An example technique of forming the construction of FIGS. 22-24 includes formation of a planarized insulator layer 60 (which may be of the same or different composition from that of insulator material 39) followed by forming sacrificial mandrels/placeholders, with gate insulator 58 and wordlines 56 being formed in a spacer-patterning or pitch-multiplication manner. An example planarized insulating material 62 (of the same or different composition from either of materials 39 and 60) is shown as having been formed thereafter.

The sacrificial structures are replaced with conductor material and formed there-from are individual upper portions of the individual vias that both: (c) directly electrically couple to one of the individual lower portions of the individual vias, and (d) directly electrically couple together the wordlines of the respective individual pairs of wordlines. Any existing or future-develop technique may be used with one example such embodiment being next described with reference to FIGS. 25-29.

Figure 25:
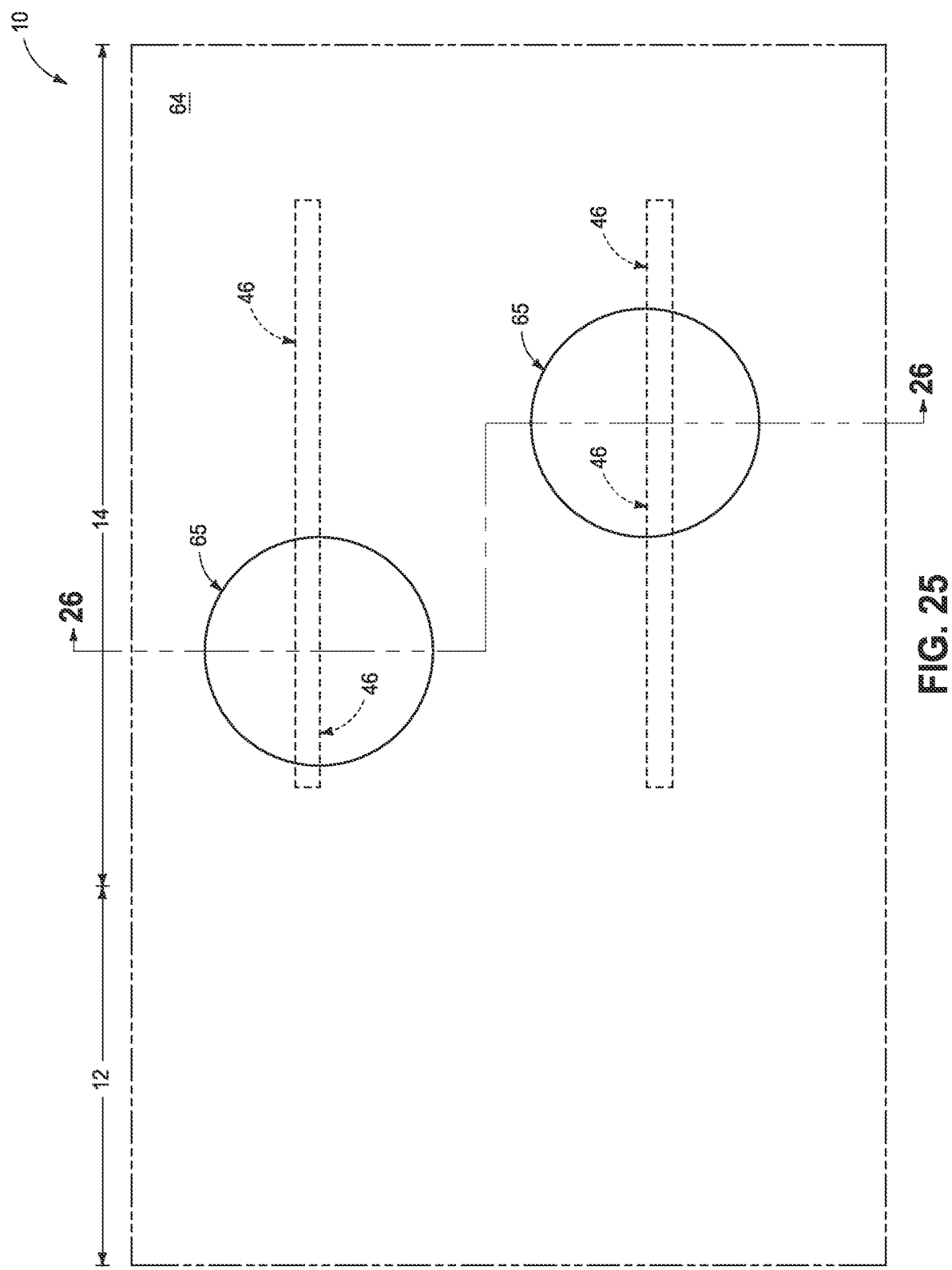
FIG. 25 is a view of the FIG. 22 construction at a processing step subsequent to that shown by FIG. 22.
Figure 26:
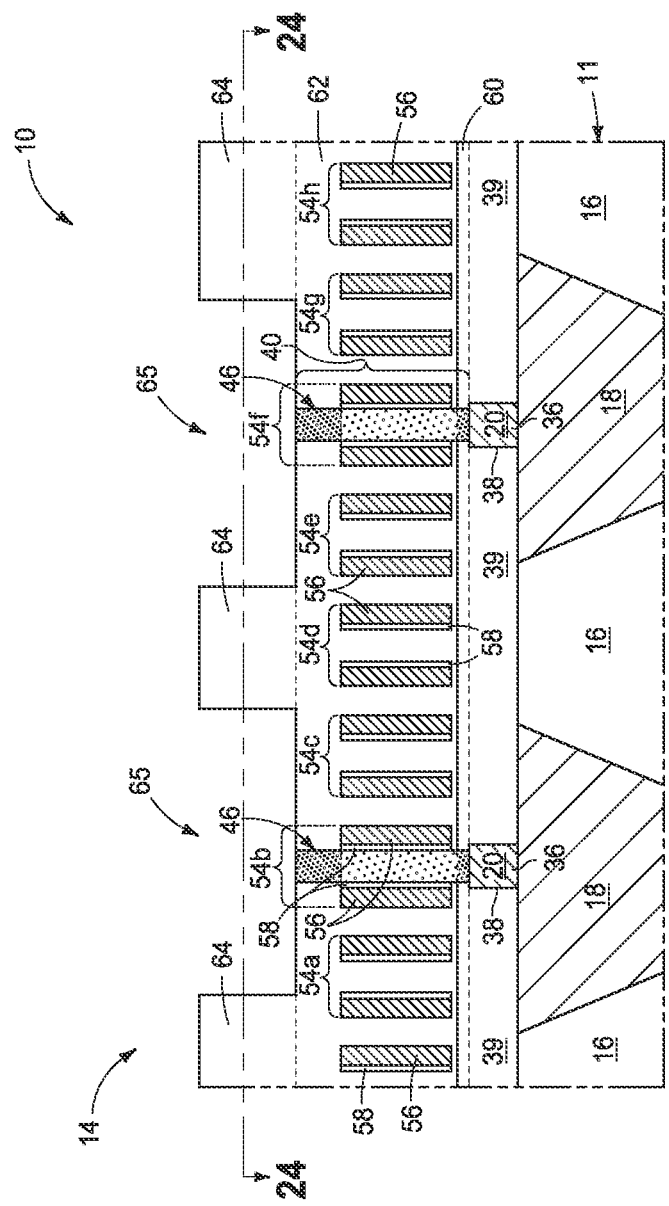
FIG. 26 is a view taken through line 26-26 in FIG. 25.

Referring to FIGS. 25 and 26, insulating material 64 (e.g., silicon dioxide or silicon nitride) has been formed atop insulating material 62. Openings 65 have been formed there-through in peripheral circuitry area 14 to sacrificial structures 46.

Figure 27:
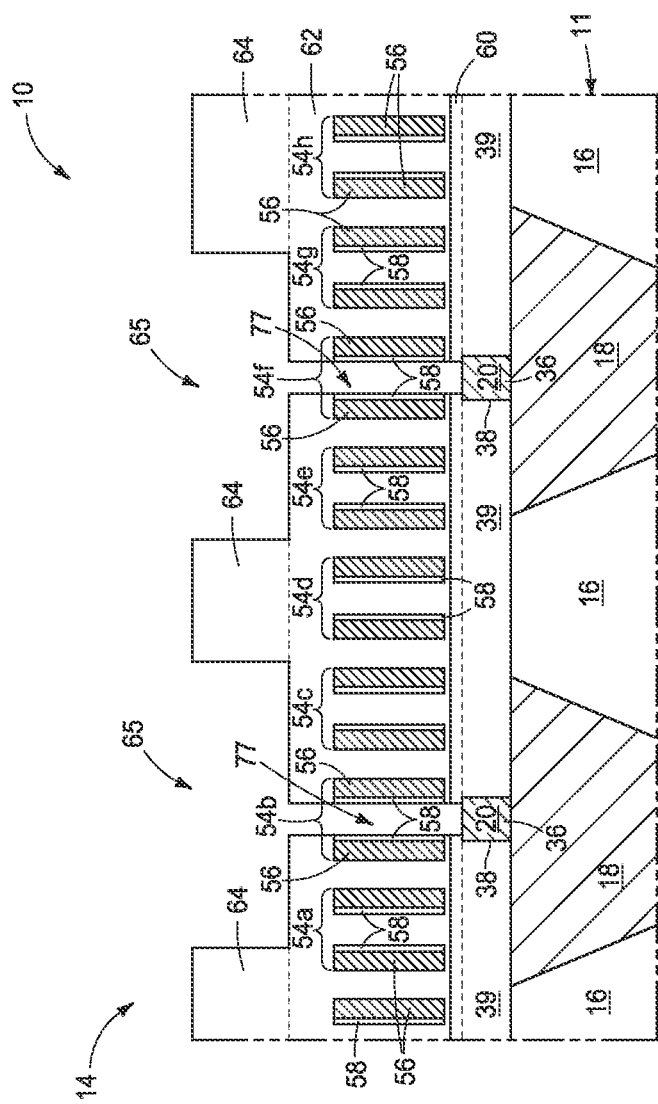
FIG. 27 is a view of the FIG. 26 construction at a processing step subsequent to that shown by FIG. 26.
Figure 28:
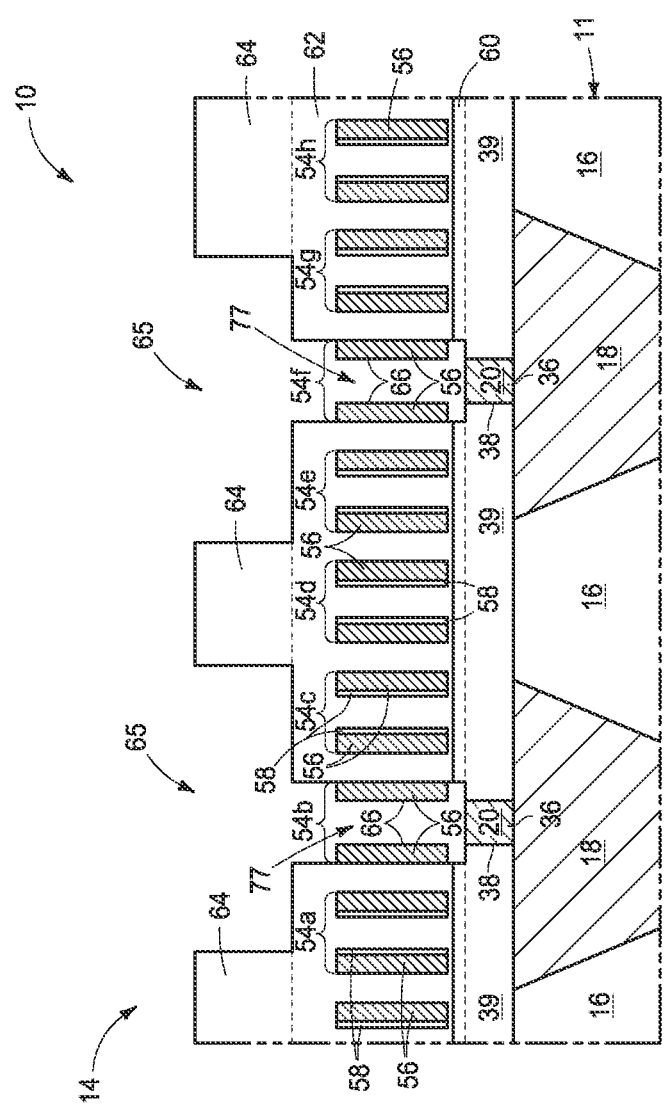
FIG. 28 is a view of the FIG. 27 construction at a processing step subsequent to that shown by FIG. 27.

Referring to FIG. 27, sacrificial structures 46 (not shown) have been etched away (e.g., by selective wet isotropic etching relative to other exposed materials, including in one embodiment selectively relative to gate insulator 58) leaving void spaces 77. Thereafter, and referring to FIG. 28, gate insulator 58 has been etched in peripheral circuitry area 14 to expose sidewalk 66 of the respective individual pairs 54* of wordlines 56. An etch-stop liner (e.g., silicon nitride if material 62 is silicon dioxide, and not shown) could be deposited over and aside wordlines 56 prior to deposition of insulating material 62 to preclude risk of the example etch shown by FIG. 28 extending laterally to expose an adjacent wordline 56.

Figure 29:
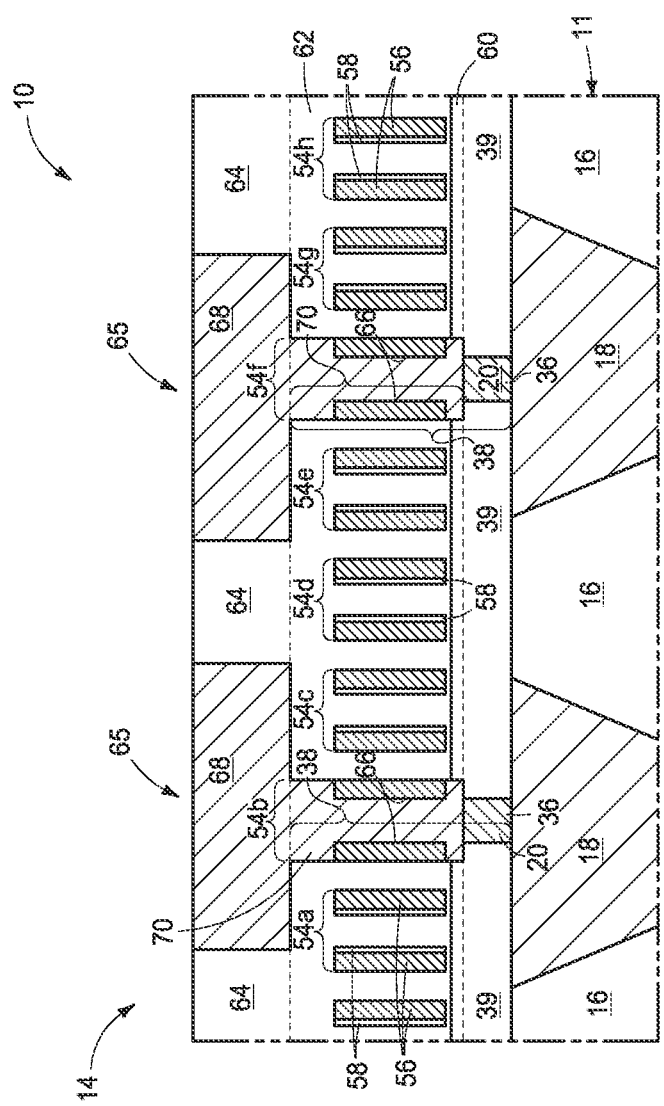
FIG. 29 is a view of the FIG. 28 construction at a processing step subsequent to that shown by FIG. 28.
Figure 30:
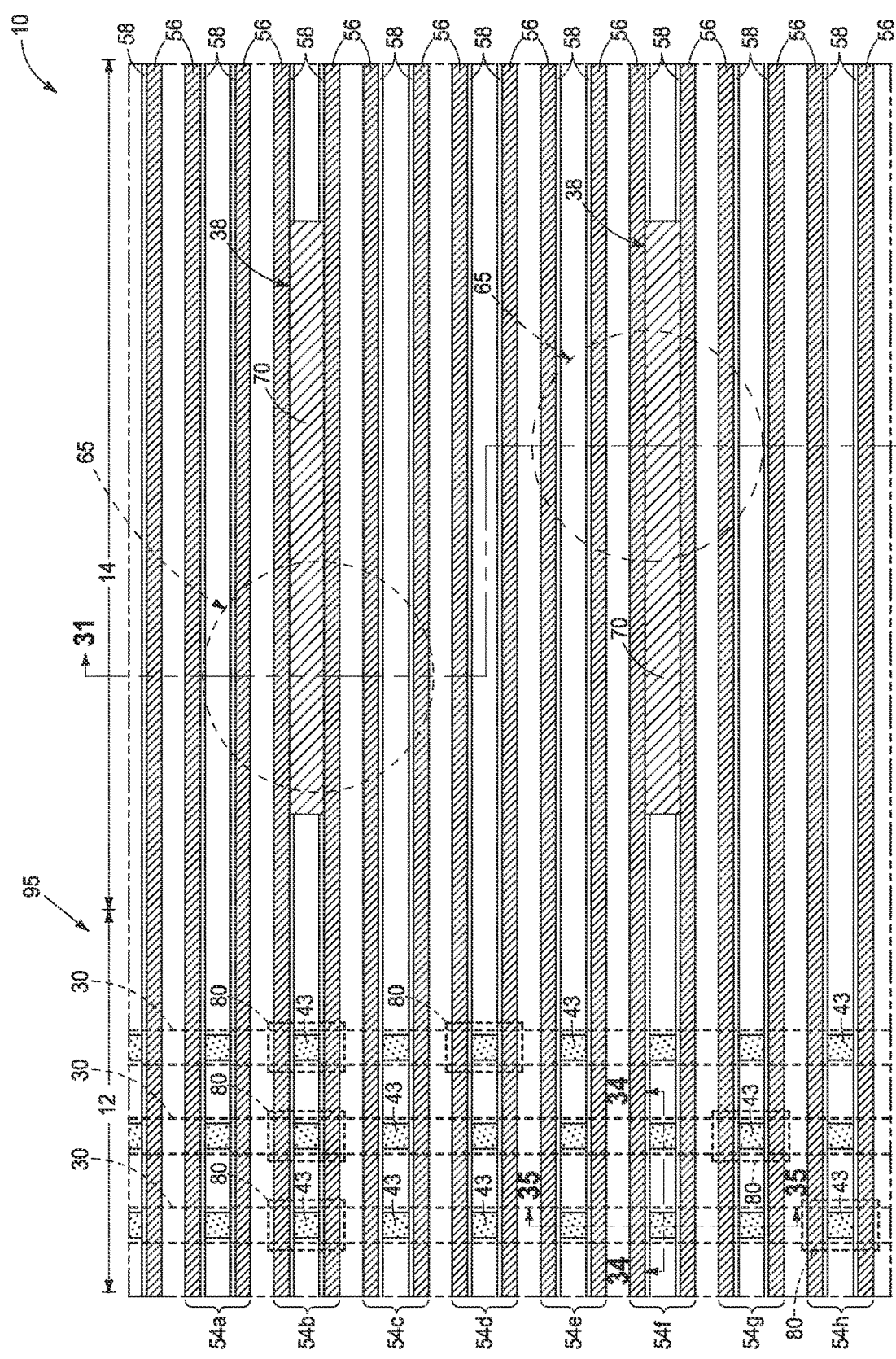
FIG. 30 is a view of the FIG. 29 construction at a processing step subsequent to that shown by FIG. 29.
Figure 31:
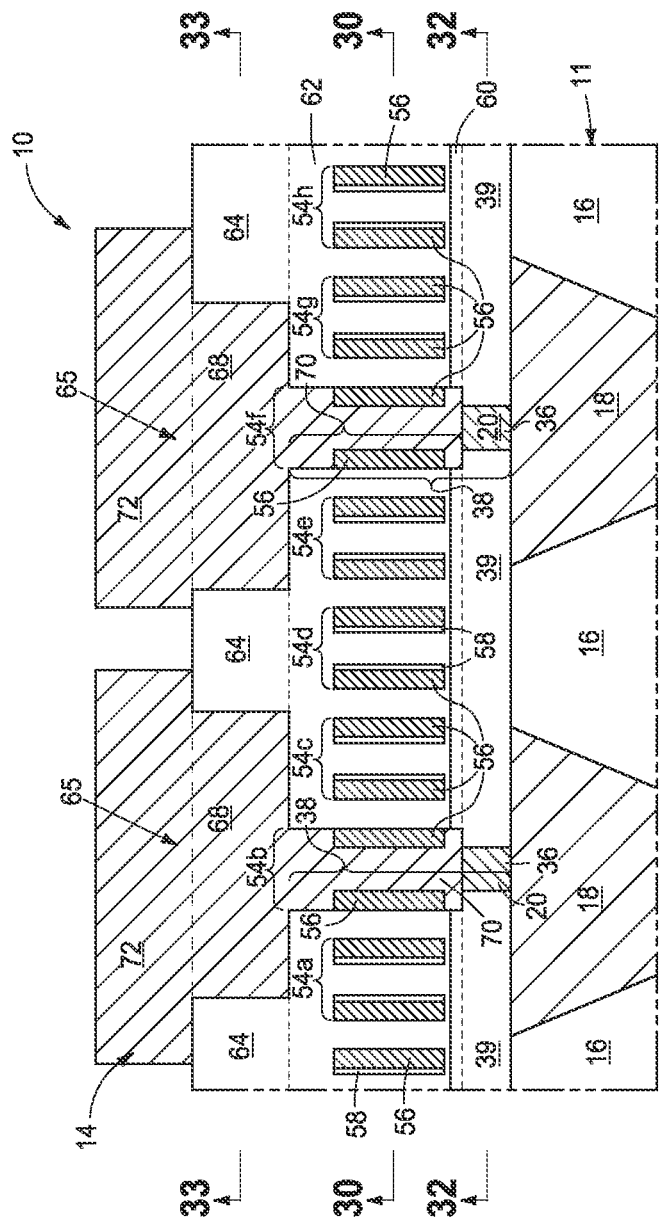
FIG. 31 is a view taken through line 31-31 in FIGS. 30 and 32.
Figure 32:
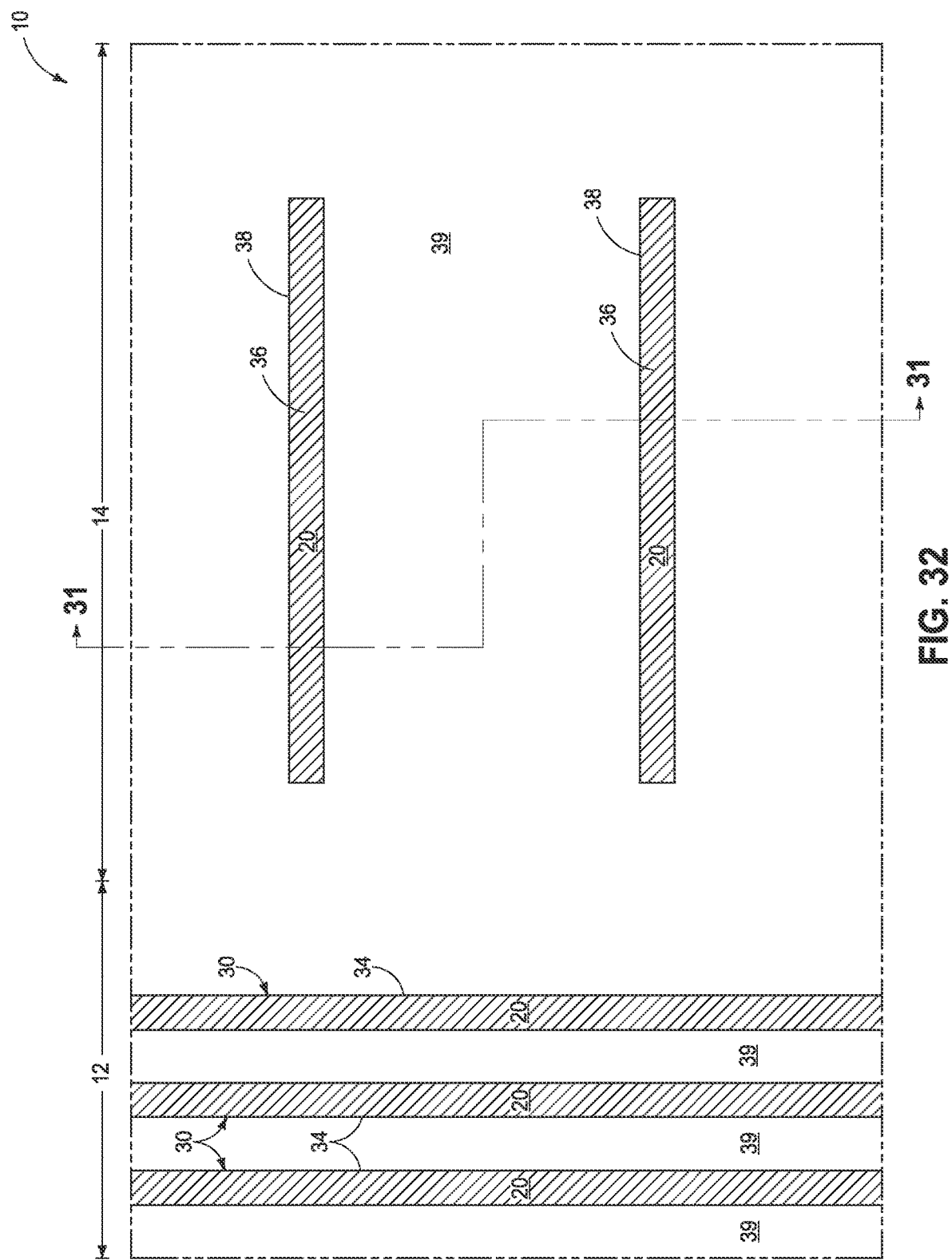
FIG. 32 is a view taken through line 32-32 in FIG. 31.
Figure 33:
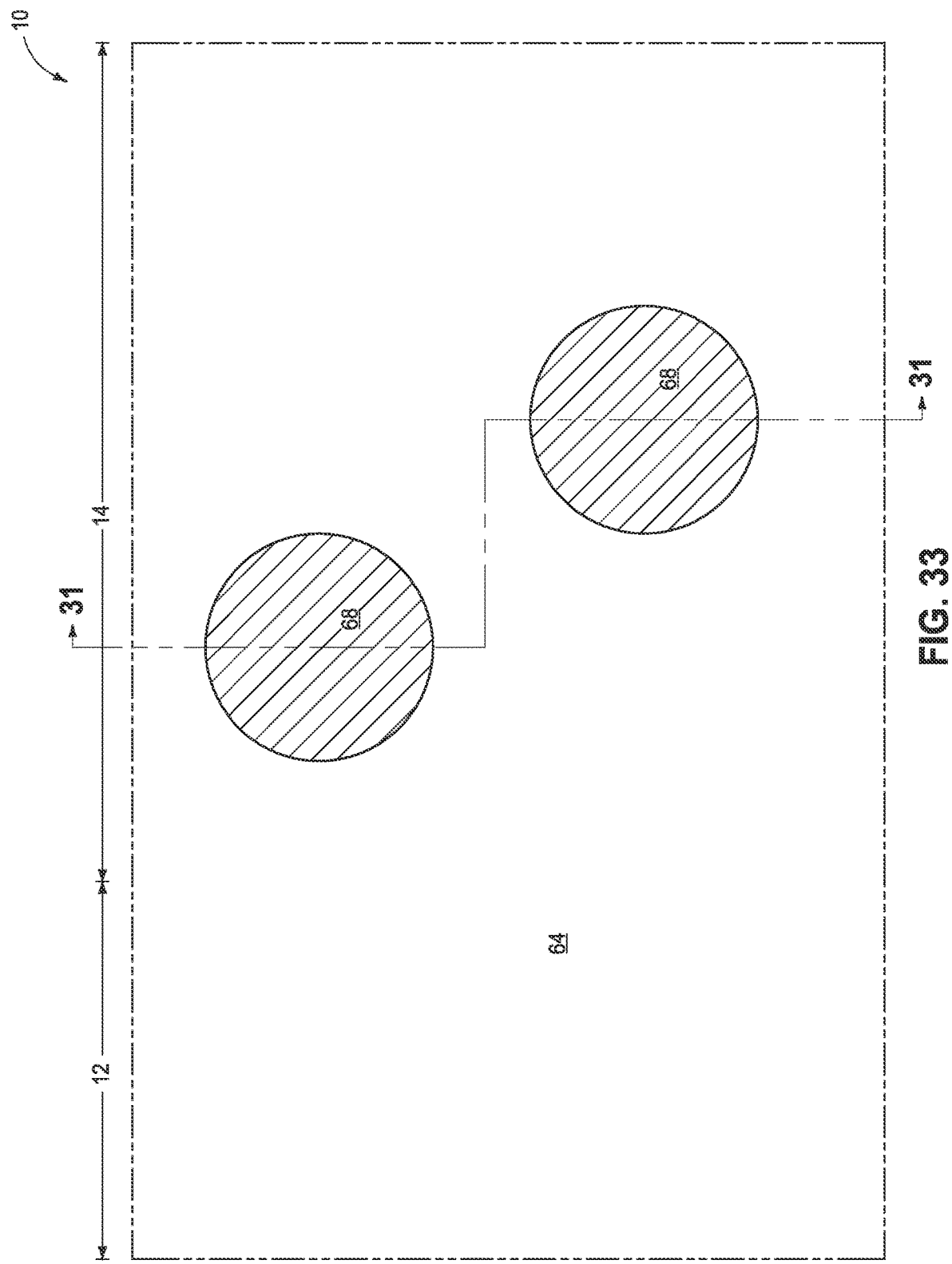
FIG. 33 is a view taken through line 33-33 in 31.
Figure 35:
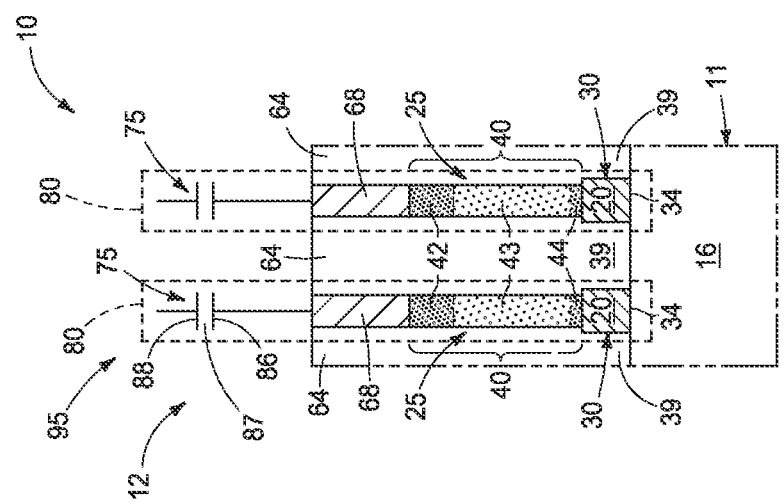
FIG. 35 is a view taken through line 35-35 in FIG. 30.
Figure 34:
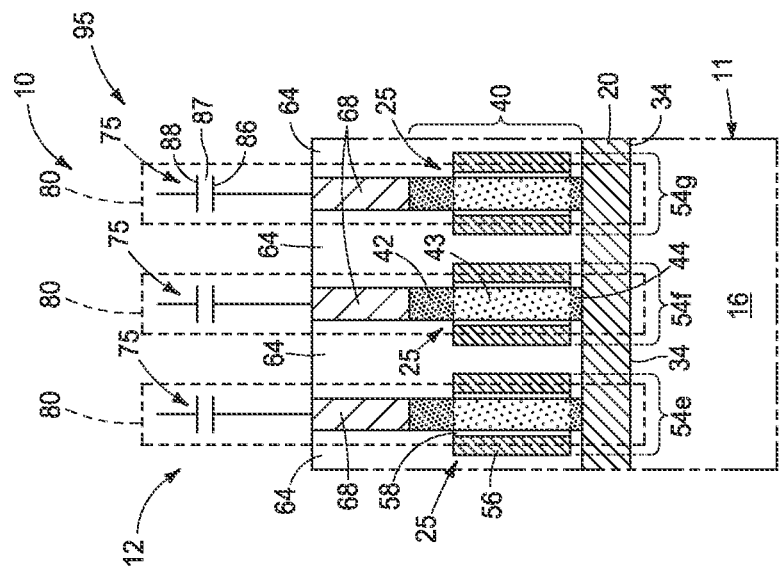
FIG. 34 is a view taken through line 34-34 in FIG. 30.

Referring to FIG. 29, conductor material 68 has been formed in openings 65 and directly against sidewalls 66 of wordlines 56. An example technique for doing so is to initially deposit conductor material 68 to overfill the FIG. 28—depicted openings, and thereafter planarizing such back at least to the elevationally-outermost surface of insulating material 64. Such has resulted in formation/expansion of conductive vias 38 that individually comprise an upper portion 70 thereof that both: (c) directly electrically couples to one of individual lower portions 36 of individual vias 38, and (d) directly electrically couples together wordlines 56 of a respective individual pair 54\* of wordlines 56.

Accordingly, and in one embodiment, the act of replacing sacrificial structures 46 comprises removing the sacrificial structures and there-after forming conductor material 68, and further comprises, before removing the sacrificial structures, forming insulating material (e.g., 64) atop the sacrificial structures. Openings (e.g., 65) are formed through the insulating material and that individually extend to one of the individual sacrificial structures, with the removing of the sacrificial structures comprising etching of the sacrificial structures through the openings. Conductor material is formed in the openings and in void spaces (e.g., 77) therebelow remaining after the etching of the sacrificial structures. In one such embodiment, after removing of the sacrificial structures by etching of the sacrificial structures through the openings, the void spaces are widened (e.g., at least by removing material 58) by etching using a different etching chemistry than was used in the etching of the sacrificial structures through the openings.

Referring to FIGS. 30-35, such by way of example only shows subsequent processing whereby conductive material 72 has been formed directly coupled to conductive material 68 and patterned as shown. A charge-storage device, such as a capacitor 75 (shown schematically in FIGS. 34 and 35) may be directly electrically coupled to conductive material 68 whereby example individual memory cells 80 (e.g., of memory circuitry 95) have been formed that individually comprise a capacitor 75 and a transistor 25. Example capacitor 75 comprises opposing capacitor electrodes 86 and 88 having a capacitor insulator 87 (e.g., silicon dioxide, silicon nitride, hafnium oxide, aluminum oxide, etc.) there-between. In one embodiment, capacitors 75 are ferroelectric capacitors with capacitor insulator 87 thereby being ferroelectric (e.g., any existing or future-developed ferroelectric material).

Any other attribute(s) or aspect(s) as shown and/or described herein with respect to other embodiments may be used with respect to the above-described embodiments.

An embodiment of the invention encompasses a method of forming memory circuitry (e.g., 95). Such a method comprises using a digitline mask (e.g., 24 or 28) to form both: (a) conductive digitlines (e.g., 34) in a memory array area (e.g., 12), and (b) lower portions (e.g., 36) of conductive vias (e.g., 38) in a peripheral circuitry area (e.g., 14) laterally of the memory array area. The lower portions of the vias electrically couple with circuitry (e.g., 18) below the vias and digitlines. In one embodiment, the individual vias are longitudinally elongated horizontally. In one such embodiment, the digitlines are longitudinally elongated parallel relative one another, the horizontally-longitudinally-elongated vias are parallel relative one another, and the vias and digitlines are longitudinally angled relative one another and in one such embodiment are longitudinally angled orthogonally relative one another. In one embodiment, the digitline mask is directly above conductive material (e.g., 20) in both the memory array area and in the peripheral circuitry area. The act of using the digitline mask to form both: (a) and (b) as stated above comprises etching the conductive material in the memory array area and in the peripheral circuitry area that is uncovered by the digitline mask. In one such embodiment, the etching of the conductive material in the memory array area and in the peripheral area is conducted simultaneously (e.g., as shown and described above with respect to one embodiment with respect to FIGS. 13 and 14). Pairs (e.g., 54\*) of conductive wordlines (e.g., 56) are formed above the digitlines in the memory array area. The pairs of wordlines extend from the memory array area into the peripheral circuitry area. Individual of the pairs are directly above individual of the lower portions of the individual vias (independent of whether vertically-extending sacrificial structures are ever formed). Individual upper portions (e.g., 70) of the individual vias are formed and that both: (c) directly electrically couple to one of the individual lower portions of the individual vias, and (d) directly electrically couple together the wordlines of the individual pair of words lines that is directly above the respective one individual lower portion of the respective individual via. Any other attribute(s) or aspect(s) as shown and/or described herein with respect to other embodiments may be used.

Embodiments of the invention encompass structures and/or devices independent of method of manufacture. Nevertheless, such structures and/or devices may have any of the attributes as described herein in method embodiments. Likewise, the above-described method embodiments may incorporate and form any of the attributes described with respect to structures and/or devices embodiments.

In one embodiment, memory circuitry (e.g., 95) comprises conductive digitlines (e.g., 34) in a memory array area (e.g., 12) and lower portions (e.g., 36) of conductive vias (e.g., 38) in a peripheral circuitry area (e.g., 14) laterally of the memory array area. The vias electrically couple with circuitry (e.g., 18) below the vias and the digitlines. Pairs (e.g., 54\*) of conductive wordlines (e.g., 56) are above the digitlines in the memory array area. The pairs of wordlines extend from the memory array area into the peripheral circuitry area. Individual of the pairs are directly above individual of the lower portions of individual of the vias. Individual upper portions (e.g., 70) of the individual vias both: (a) directly electrically couple to one of the individual lower portions of the individual vias, and (b) directly electrically couple together the wordlines of the individual pair of wordlines that is directly above the respective one individual lower portion of the respective individual via. In one embodiment, the digitlines in the lower portions of the vias are at the same elevation relative one another within a substrate construction (e.g., 10) comprising the memory circuitry. Any other attribute(s) or aspect(s) as shown and/or described herein with respect to other embodiments may be used.

An embodiment of the invention comprises memory circuitry (e.g., 95) comprising conductive digitlines (e.g., 34) in a memory array area (e.g., 12). Pairs (e.g., 54\*) of conductive wordlines (e.g., 56) are in the memory array area. The pairs of wordlines are vertically spaced relative to the digitlines (independent of whether above or below) and extend from the memory array area into a peripheral circuitry area (e.g., 14) laterally of the memory array area, Upper circuitry (e.g., that includes 72) is above the digitlines and the pairs of wordlines. Lower circuitry (e.g., that includes 18) is below the digitlines and the pairs of wordlines. Conductive vias (e.g., 38) in the peripheral circuitry area directly electrically couple circuit components (e.g., 72) of the upper circuitry with circuit components (e.g., 18) of the lower circuitry. The vias individually directly electrically couple together the wordlines of individual of the pairs of the wordlines. In one embodiment, the pairs of conductive wordlines are above the conductive digitlines. Any other attribute(s) or aspect(s) as shown and/or described herein with respect to other embodiments may be used.

In one embodiment, memory circuitry (e.g., 95) comprises conductive digitlines (e.g., 34) in a memory array area (e.g., 12) and lower portions (e.g., 36) of conductive vias (e.g., 38) that are in a peripheral circuitry area (e.g., 14) laterally of the memory array area. The vias electrically couple with circuitry (e.g., that includes 18) below the vias and the digitlines. Pairs (e.g., 54*) of conductive wordlines (e.g., 56) are above the digitlines in the memory array area. The pairs of wordlines extend from the memory array area into the peripheral circuitry area. Individual of the pairs are directly above individual of the lower portions of the individual vias. The memory circuitry comprises memory cells (e.g., 80) individually comprising a transistor (e.g., 25) and a ferroelectric capacitor (e.g., 75). The transistor comprises a vertical channel (e.g., 43) laterally between the wordlines of one of the individual pairs of wordlines. A lower source drain region (e.g., 44) is below the channel and is directly electrically coupled to one of the digitlines. An upper source/drain region (e.g., 42) is above the channel. The ferroelectric capacitor comprises a lower capacitor electrode (e.g., 86) an upper capacitor electrode (e.g., 88), and a ferroelectric capacitor insulator (e.g., 87) vertically between the lower capacitor electrode and the upper capacitor electrode. The lower capacitor electrode is directly electrically coupled to the upper source/drain region. Individual upper portions (e.g., 70) of the individual vias both: (a) directly electrically coupled to one of the individual lower portions of the individual vias, (b) directly electrically couple together the wordlines of the individual pair of wordlines that is directly above the respective one individual lower portion of the respective individual via. Any other attribute(s) or aspect(s) as shown and/or described herein with respect to other embodiments may be used.

The above processing or construction may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method of forming memory circuitry, comprises using a digitline mask to form both: (a) conductive digitlines in a memory array area, and (b) lower portions of conductive vias in a peripheral circuitry area laterally of the memory array area. The lower portions of the vias electrically couple with circuitry below the vias and the digitlines. Pairs of conductive wordlines are formed above the digitlines in the memory array area. The pairs of wordlines extend from the memory array area into the peripheral circuitry area. Individual of the pairs are directly above individual of the lower portions of individual of the vias. Individual upper portions of the individual vias are formed. The individual upper portions both: (c) directly electrically couple to one of the individual lower portions of the individual vias, and (d) directly electrically couple together the wordlines of the individual pair of wordlines that are directly above the respective one individual lower portion of the respective individual via.

In some embodiments, a method of forming memory circuitry, comprises forming a mask above the conductive material. The mask comprises a plurality of digitline outlines in a memory array area and a plurality of outlines of lower portions of conductive vias in a peripheral circuitry area laterally of the memory array area. The mask is used while etching unmasked portions of the conductive material to form conductive digitlines that comprise the conductive material in the memory array area and to form lower portions of conductive vias that comprise the conductive material in the peripheral circuitry area. A vertically-extending sacrificial structure is formed directly above individual of the lower portions of individual of the vias. Pairs of conductive wordlines are formed above the digitlines in the memory array area. The pairs of wordlines extend from the memory array area into the peripheral circuitry area. The wordlines of individual of the pairs are against opposing sides of individual of the sacrificial structures. The sacrificial structures are replaced with conductor material and individual upper portions of the individual vias are formed there-from that both: (a) directly electrically couple to one of the individual lower portions of the individual vias, and (b) directly electrically couple together the wordlines of the respective individual pairs of wordlines.

In some embodiments, memory circuitry comprises conductive digitlines in a memory array area and lower portions of conductive vias in a peripheral circuitry area laterally of the memory array area. The vias electrically couple with circuitry below the vias and the digitlines. Pairs of conductive wordlines are above the digitlines in the memory array area. The pairs of wordlines extend from the memory array area into the peripheral circuitry area. Individual of the pairs are directly above individual of the lower portions of individual of the vias and individual upper portions of the individual vias. The individual upper portions both: (a) directly electrically couple to one of the individual lower portions of the individual vias, and (b) directly electrically couple together the wordlines of the individual pair of wordlines that are directly above the respective one individual lower portion of the respective individual via.

In some embodiments, memory circuitry comprises conductive digitlines in a memory array area. Pairs of conductive wordlines are in the memory array area, are vertically spaced relative to the digitlines, and extend from the memory array area into a peripheral circuitry area laterally of the memory array area. Upper circuitry is above the digitlines and the pairs of wordlines. Lower circuitry is below the digitlines and the pairs of wordlines. Conductive vias are in the peripheral circuitry area and directly electrically couple circuit components of the upper circuitry with circuit components of the lower circuitry. The vias individually directly electrically couple together the wordlines of individual of the pairs of wordlines.

In some embodiments, memory circuitry comprises conductive digitlines in a memory array area and lower portions of conductive vias in a peripheral circuitry area laterally of the memory array area. The vias electrically couple with circuitry below the vias and the digitlines. Pairs of conductive wordlines are above the digitlines in the memory array area. The pairs of wordlines extend from the memory array area into the peripheral circuitry area. Individual of the pairs are directly above individual of the lower portions of individual of the vias. Memory cells of the memory circuitry individually comprise a transistor and a ferroelectric capacitor. The transistor comprises a vertical channel laterally between the wordlines of one of the individual pairs of wordlines. A lower source/drain region is below the channel and directly electrically couples to one of the digitlines. An upper source/drain region is above the channel. The ferroelectric capacitor comprises a lower capacitor electrode, an upper capacitor electrode, and a ferroelectric capacitor insulator vertically between the lower capacitor electrode and the upper capacitor electrode. The lower capacitor electrode is directly electrically coupled to the upper source/drain region. Individual upper portions of the individual vias both: (a) directly electrically couple to one of the individual lower portions of the individual vias, and (b) directly electrically couple together the wordlines of the individual pair of wordlines that are directly above the respective one individual lower portion of the respective individual via.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Memory circuitry comprising:
    conductive digitlines in a memory array area and lower portions of conductive vias in a peripheral circuitry area laterally of the memory array area, the vias electrically coupling with circuitry below the vias and the digitlines;
    pairs of conductive wordlines above the digitlines in the memory array area, the pairs of wordlines extending from the memory array area into the peripheral circuitry area, individual of the pairs being directly above individual of the lower portions of individual of the vias; and
    individual upper portions of the individual vias, the individual upper portions both: (a) directly electrically coupling to one of the individual lower portions of the individual vias, and (b) directly electrically coupling together the wordlines of the individual pair of wordlines that is directly above the respective one individual lower portion of the respective individual via.

2. The memory circuitry of claim 1 wherein the digitlines and the lower portions of the vias are at the same elevation relative one another within a substrate construction comprising the memory circuitry.

3. The memory circuitry of claim 1 wherein the individual vias are longitudinally elongated horizontally.

4. The memory circuitry of claim 3 wherein,
    the digitlines are longitudinally elongated parallel relative one another;
    the horizontally-longitudinally-elongated vias are parallel relative one another; and
    the vias and digitlines are longitudinally angled relative one another.

5. The memory circuitry of claim 4 wherein the vias and digitlines are longitudinally angled orthogonally relative one another.

6. Memory circuitry comprising:
    conductive digitlines in a memory array area;
    pairs of conductive wordlines in the memory array area, the pairs of wordlines being vertically spaced relative to the digitlines and extending from the memory array area into a peripheral circuitry area laterally of the memory array area;
    upper circuitry above the digitlines and the pairs of wordlines;
    lower circuitry below the digitlines and the pairs of wordlines; and
    conductive vias in the peripheral circuitry area directly electrically coupling circuit components of the upper circuitry with circuit components of the lower circuitry, the vias individually directly electrically coupling together the wordlines of individual of the pairs of wordlines.

7. The memory circuitry of claim 6 wherein the individual vias are longitudinally elongated horizontally.

8. The memory circuitry of claim 7 wherein,
    the digitlines are longitudinally elongated parallel relative one another;
    the horizontally-longitudinally-elongated vias are parallel relative one another; and
    the vias and digitlines are longitudinally angled relative one another.

9. The memory circuitry of claim 6 wherein the pairs of conductive wordlines are above the conductive digitlines.

10. Memory circuitry comprising:
    conductive digitlines in a memory array area and lower portions of conductive vias in a peripheral circuitry area laterally of the memory array area, the vias electrically coupling with circuitry below the vias and the digitlines;
    pairs of conductive wordlines above the digitlines in the memory array area, the pairs of wordlines extending from the memory array area into the peripheral circuitry area, individual of the pairs being directly above individual of the lower portions of individual of the vias;
    memory cells individually comprising a transistor and a ferroelectric capacitor;
    the transistor comprising:
        a vertical channel laterally between the wordlines of one of the individual pairs of wordlines;
        a lower source/drain region below the channel and directly electrically coupled to one of the digitlines; and
        an upper source/drain region above the channel; and
    the ferroelectric capacitor comprising:
        a lower capacitor electrode;
        an upper capacitor electrode;
        a ferroelectric capacitor insulator vertically between the lower capacitor electrode and the upper capacitor electrode; and
        the lower capacitor electrode being directly electrically coupled to the upper source/drain region; and
    individual upper portions of the individual vias, the individual upper portions both: (a) directly electrically coupling to one of the individual lower portions of the individual vias, and (b) directly electrically coupling together the wordlines of the individual pair of wordlines that is directly above the respective one individual lower portion of the respective individual via.

11. The memory circuitry of claim 10 wherein the digitlines and the lower portions of the vias are at the same elevation relative one another within a substrate construction comprising the memory circuitry.

* * * * *